(12) United States Patent
Pradhan et al.

(10) Patent No.: US 7,922,880 B1
(45) Date of Patent: Apr. 12, 2011

(54) METHOD AND APPARATUS FOR INCREASING LOCAL PLASMA DENSITY IN MAGNETICALLY CONFINED PLASMA

(75) Inventors: Anshu A. Pradhan, San Jose, CA (US); Douglas B. Hayden, San Jose, CA (US); Ronald L. Kinder, Oakland, CA (US); Alexander Dulkin, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 770 days.

(21) Appl. No.: 11/807,182

(22) Filed: May 24, 2007

(51) Int. Cl.
C23C 14/35 (2006.01)
C23C 16/00 (2006.01)

(52) U.S. Cl. ......... 204/298.06; 204/298.03; 204/298.08; 204/298.14; 118/723 E; 118/723 ER; 156/345.43; 156/345.44; 156/345.45

(58) Field of Classification Search ............ 204/298.03, 204/298.06, 298.08, 298.14; 118/723 E, 118/723 ER; 156/345.35, 345.43, 345.44, 156/345.45, 345.47
See application file for complete search history.

(56) References Cited

U.S. PATENT DOCUMENTS

| | | | |
|---|---|---|---|
| 3,763,031 A * | 10/1973 | Scow et al. | 204/298.08 |
| 3,767,551 A * | 10/1973 | Lang et al. | 204/192.12 |
| 584,430 A | 11/1977 | Suntola et al. | |
| 4,392,111 A | 7/1983 | Rostoker | |
| 4,492,620 A | 1/1985 | Matsuo et al. | |
| 4,588,490 A | 5/1986 | Cuomo et al. | |
| 4,604,180 A | 8/1986 | Hirukawa et al. | |
| 4,609,903 A | 9/1986 | Toyokura et al. | |
| 4,622,121 A | 11/1986 | Wegmann et al. | |
| 4,737,384 A | 4/1988 | Murthy et al. | |
| 4,874,493 A | 10/1989 | Pan | |
| 4,963,524 A * | 10/1990 | Yamazaki | 505/400 |
| 4,997,539 A * | 3/1991 | Komizo et al. | 204/192.2 |
| 4,999,096 A | 3/1991 | Nihei et al. | |
| 5,009,963 A | 4/1991 | Ohmi et al. | |

(Continued)

FOREIGN PATENT DOCUMENTS

CN 1567548 1/2005

(Continued)

OTHER PUBLICATIONS

Schumacher Products, TDEAT (Tetrakis-diethylamino Titanium), Electronic Grade, www.schumacher.com/tdeat.html, printed Jun. 5, 2001, 1 page.

(Continued)

*Primary Examiner* — Rodney G McDonald
(74) *Attorney, Agent, or Firm* — Weaver Austin Villeneuve & Sampson LLP

(57) ABSTRACT

Local plasma density, e.g., the plasma density in the vicinity of the substrate, is increased by providing an ion extractor configured to transfer ions and electrons from a first region of magnetically confined plasma (typically a region of higher density plasma) to a second region of plasma (typically a region of lower density plasma). The second region of plasma is preferably also magnetically shaped or confined and resides between the first region of plasma and the substrate. A positively biased conductive member positioned proximate the second region of plasma serves as an ion extractor. A positive bias of about 50-300 V is applied to the ion extractor causing electrons and subsequently ions to be transferred from the first region of plasma to the vicinity of the substrate, thereby forming higher density plasma. Provided methods and apparatus are used for deposition and resputtering.

30 Claims, 14 Drawing Sheets

U.S. PATENT DOCUMENTS

| | | | |
|---|---|---|---|
| 5,084,412 A | 1/1992 | Nakasaki | |
| 5,126,028 A * | 6/1992 | Hurwitt et al. | 204/192.13 |
| 5,139,825 A | 8/1992 | Gordon et al. | |
| 5,178,739 A | 1/1993 | Barnes et al. | |
| 5,194,398 A | 3/1993 | Miyachi et al. | |
| 5,221,449 A | 6/1993 | Colgan et al. | |
| 5,281,485 A | 1/1994 | Colgan et al. | |
| 5,298,091 A | 3/1994 | Edwards, III et al. | |
| 5,378,506 A | 1/1995 | Imai et al. | |
| 5,482,611 A | 1/1996 | Helmer et al. | |
| 5,622,608 A | 4/1997 | Lanford et al. | |
| 5,629,221 A | 5/1997 | Chao et al. | |
| 5,654,233 A | 8/1997 | Yu | |
| 5,656,860 A | 8/1997 | Lee | |
| 5,766,379 A | 6/1998 | Lanford et al. | |
| 5,789,027 A | 8/1998 | Watkins et al. | |
| 5,801,089 A | 9/1998 | Kenney | |
| 5,904,565 A | 5/1999 | Nguyen et al. | |
| 5,948,215 A * | 9/1999 | Lantsman | 204/192.12 |
| 5,962,923 A | 10/1999 | Xu et al. | |
| 5,969,422 A | 10/1999 | Ting et al. | |
| 5,985,762 A | 11/1999 | Geffken et al. | |
| 6,037,257 A | 3/2000 | Chiang et al. | |
| 6,046,108 A | 4/2000 | Liu et al. | |
| 6,074,544 A | 6/2000 | Reid et al. | |
| 6,077,403 A * | 6/2000 | Kobayashi et al. | 204/192.12 |
| 6,077,780 A | 6/2000 | Dubin | |
| 6,080,285 A | 6/2000 | Liu et al. | |
| 6,093,966 A | 7/2000 | Venkatraman et al. | |
| 6,099,702 A | 8/2000 | Reid et al. | |
| 6,100,200 A | 8/2000 | Van Buskirk et al. | |
| 6,105,078 A | 8/2000 | Crockett et al. | |
| 6,110,346 A | 8/2000 | Reid et al. | |
| 6,114,238 A | 9/2000 | Liao | |
| 6,120,641 A | 9/2000 | Stevens et al. | |
| 6,124,203 A | 9/2000 | Joo et al. | |
| 6,126,798 A | 10/2000 | Reid et al. | |
| 6,139,712 A | 10/2000 | Patton et al. | |
| 6,147,000 A | 11/2000 | You et al. | |
| 6,156,167 A | 12/2000 | Patton et al. | |
| 6,159,354 A | 12/2000 | Contolini et al. | |
| 6,159,857 A | 12/2000 | Liu et al. | |
| 6,162,344 A | 12/2000 | Reid et al. | |
| 6,179,973 B1 | 1/2001 | Lai et al. | |
| 6,179,983 B1 | 1/2001 | Reid et al. | |
| 6,193,854 B1 | 2/2001 | Lai et al. | |
| 6,200,893 B1 | 3/2001 | Sneh | |
| 6,203,613 B1 | 3/2001 | Gates et al. | |
| 6,217,716 B1 | 4/2001 | Fai Lai | |
| 6,221,757 B1 | 4/2001 | Schmidbauer et al. | |
| 6,228,754 B1 | 5/2001 | Iacoponi et al. | |
| 6,235,163 B1 | 5/2001 | Angelo et al. | |
| 6,249,055 B1 | 6/2001 | Dubin | |
| 6,251,242 B1 | 6/2001 | Fu et al. | |
| 6,265,313 B1 | 7/2001 | Huang et al. | |
| 6,271,591 B1 | 8/2001 | Dubin et al. | |
| 6,274,008 B1 | 8/2001 | Gopalraja et al. | |
| 6,277,249 B1 | 8/2001 | Gopalraja et al. | |
| 6,280,597 B1 | 8/2001 | Kashiwada et al. | |
| 6,287,977 B1 | 9/2001 | Hashim et al. | |
| 6,333,547 B1 | 12/2001 | Tanaka et al. | |
| 6,340,435 B1 | 1/2002 | Bjorkman et al. | |
| 6,342,133 B2 | 1/2002 | D'Couto et al. | |
| 6,342,448 B1 | 1/2002 | Lin et al. | |
| 6,350,353 B2 | 2/2002 | Gopalraja et al. | |
| 6,358,376 B1 * | 3/2002 | Wang et al. | 204/192.12 |
| 6,387,805 B2 | 5/2002 | Ding et al. | |
| 6,391,785 B1 | 5/2002 | Satta et al. | |
| 6,395,642 B1 | 5/2002 | Liu et al. | |
| 6,402,907 B1 | 6/2002 | Rich | |
| 6,417,094 B1 | 7/2002 | Zhao et al. | |
| 6,436,251 B2 | 8/2002 | Gopalraja et al. | |
| 6,440,854 B1 | 8/2002 | Rozbicki | |
| 6,444,104 B2 | 9/2002 | Gopalraja et al. | |
| 6,448,176 B1 | 9/2002 | Grill et al. | |
| 6,451,177 B1 | 9/2002 | Gopalraja et al. | |
| 6,492,262 B2 | 12/2002 | Uzoh | |
| 6,498,091 B1 | 12/2002 | Chen et al. | |
| 6,500,762 B2 | 12/2002 | Hashim et al. | |
| 6,509,267 B1 | 1/2003 | Woo et al. | |
| 6,538,324 B1 | 3/2003 | Tagami et al. | |
| 6,541,374 B1 | 4/2003 | de Felipe et al. | |
| 6,554,914 B1 | 4/2003 | Rozbicki et al. | |
| 6,559,061 B2 | 5/2003 | Hashim et al. | |
| 6,562,715 B1 | 5/2003 | Chen et al. | |
| 6,566,246 B1 | 5/2003 | de Felipe et al. | |
| 6,589,887 B1 | 7/2003 | Dalton et al. | |
| 6,605,534 B1 | 8/2003 | Chung et al. | |
| 6,607,977 B1 | 8/2003 | Rozbicki et al. | |
| 6,607,982 B1 | 8/2003 | Powell et al. | |
| 6,613,199 B1 | 9/2003 | Tobin et al. | |
| 6,624,066 B2 | 9/2003 | Lu et al. | |
| 6,642,146 B1 | 11/2003 | Rozbicki et al. | |
| 6,652,718 B1 | 11/2003 | D'Couto et al. | |
| 6,656,841 B1 | 12/2003 | Kim | |
| 6,660,622 B2 | 12/2003 | Chen et al. | |
| 6,673,716 B1 | 1/2004 | D'Couto et al. | |
| 6,683,425 B1 * | 1/2004 | Lai | 315/500 |
| 6,706,142 B2 | 3/2004 | Savas et al. | |
| 6,706,155 B2 | 3/2004 | Morimoto et al. | |
| 6,709,557 B1 | 3/2004 | Kailasam et al. | |
| 6,709,987 B2 | 3/2004 | Hashim et al. | |
| 6,755,945 B2 | 6/2004 | Yasar et al. | |
| 6,758,947 B2 | 7/2004 | Chiang et al. | |
| 6,764,940 B1 | 7/2004 | Rozbicki et al. | |
| 6,784,096 B2 | 8/2004 | Chen et al. | |
| 6,790,776 B2 | 9/2004 | Ding et al. | |
| 6,841,044 B1 | 1/2005 | Ruzic | |
| 6,893,541 B2 | 5/2005 | Chiang et al. | |
| 6,905,965 B2 | 6/2005 | Subrahmanyan et al. | |
| 6,919,275 B2 | 7/2005 | Chiang et al. | |
| 6,943,111 B2 | 9/2005 | Lin et al. | |
| 6,949,457 B1 | 9/2005 | Fiordalice et al. | |
| 6,969,448 B1 | 11/2005 | Lau | |
| 6,992,012 B2 | 1/2006 | Hashim et al. | |
| 7,030,031 B2 | 4/2006 | Wille et al. | |
| 7,037,830 B1 | 5/2006 | Rumer et al. | |
| 7,048,837 B2 | 5/2006 | Somekh et al. | |
| 7,074,714 B2 | 7/2006 | Chiang et al. | |
| 7,135,402 B2 | 11/2006 | Lin et al. | |
| 7,186,648 B1 | 3/2007 | Rozbicki et al. | |
| 7,253,109 B2 | 8/2007 | Ding et al. | |
| 7,294,574 B2 | 11/2007 | Ding et al. | |
| 7,365,001 B2 | 4/2008 | Yang et al. | |
| 7,510,634 B1 | 3/2009 | Klawuhn et al. | |
| 7,645,696 B1 | 1/2010 | Dulkin et al. | |
| 7,659,197 B1 | 2/2010 | Juliano | |
| 7,682,966 B1 | 3/2010 | Rozbicki et al. | |
| 2001/0039113 A1 | 11/2001 | Blalock et al. | |
| 2002/0000382 A1 | 1/2002 | Morrissey et al. | |
| 2002/0028576 A1 | 3/2002 | Hashim et al. | |
| 2002/0041028 A1 | 4/2002 | Choi et al. | |
| 2002/0110999 A1 | 8/2002 | Lu et al. | |
| 2002/0115287 A1 | 8/2002 | Hashim et al. | |
| 2003/0034244 A1 | 2/2003 | Yasar et al. | |
| 2003/0116427 A1 | 6/2003 | Ding et al. | |
| 2003/0129828 A1 | 7/2003 | Cohen | |
| 2003/0216035 A1 | 11/2003 | Rengarajan et al. | |
| 2004/0048461 A1 | 3/2004 | Chen et al. | |
| 2004/0094402 A1 | 5/2004 | Gopalraja et al. | |
| 2004/0152301 A1 | 8/2004 | Hashim et al. | |
| 2004/0171250 A1 | 9/2004 | Chiang et al. | |
| 2004/0188239 A1 | 9/2004 | Robison et al. | |
| 2004/0211661 A1 | 10/2004 | Zhang et al. | |
| 2004/0224507 A1 | 11/2004 | Marieb et al. | |
| 2004/0266175 A1 | 12/2004 | Chen et al. | |
| 2005/0006222 A1 | 1/2005 | Ding et al. | |
| 2005/0020080 A1 | 1/2005 | Chiang et al. | |
| 2005/0032382 A1 | 2/2005 | Rossman | |
| 2005/0085068 A1 | 4/2005 | Chiang et al. | |
| 2005/0085070 A1 | 4/2005 | Park | |
| 2005/0103620 A1 | 5/2005 | Chistyakov | |
| 2005/0106865 A1 | 5/2005 | Chung et al. | |
| 2005/0110147 A1 | 5/2005 | Wu et al. | |
| 2005/0173239 A1 | 8/2005 | Somekh et al. | |
| 2005/0186793 A1 | 8/2005 | Omoto et al. | |
| 2005/0211545 A1 | 9/2005 | Cerio et al. | |

| | | |
|---|---|---|
| 2005/0252765 A1 | 11/2005 | Zhang et al. |
| 2005/0255690 A1 | 11/2005 | Chen et al. |
| 2005/0255691 A1 | 11/2005 | Ding et al. |
| 2005/0255700 A1 | 11/2005 | Gopalraja et al. |
| 2005/0266682 A1 | 12/2005 | Chen et al. |
| 2005/0272254 A1 | 12/2005 | Ding et al. |
| 2006/0014378 A1 | 1/2006 | Aggrawal et al. |
| 2006/0024953 A1 | 2/2006 | Papa Rao et al. |
| 2006/0030151 A1 | 2/2006 | Ding et al. |
| 2006/0057843 A1 | 3/2006 | Chen et al. |
| 2006/0125100 A1 | 6/2006 | Arakawa |
| 2006/0148253 A1 | 7/2006 | Chung et al. |
| 2006/0207873 A1 | 9/2006 | Fu |
| 2006/0258152 A1 | 11/2006 | Haider |
| 2007/0020922 A1 | 1/2007 | Chiang et al. |
| 2007/0178682 A1 | 8/2007 | Chiang et al. |
| 2007/0193982 A1 | 8/2007 | Brown et al. |
| 2007/0197012 A1 | 8/2007 | Yang et al. |
| 2007/0283886 A1 | 12/2007 | Chung et al. |
| 2008/0142359 A1 | 6/2008 | Gopalraja et al. |
| 2008/0190760 A1 | 8/2008 | Tang et al. |
| 2008/0310005 A1 | 12/2008 | Tonar et al. |
| 2009/0233438 A1 | 9/2009 | Ding et al. |

FOREIGN PATENT DOCUMENTS

| | | |
|---|---|---|
| EP | 0 692 551 A1 | 1/1996 |
| JP | 11-186273 | 9/1999 |

OTHER PUBLICATIONS

Sun et al., Suppression of Cobalt Silicide Agglomeration Using Nitrogen (N2+) Implantation, IEEE Electron Device Letters, vol. 19, No. 5, May 1998, pp. 163-166.
Ashanti et al., "A New Hollow-Cathode Magnetron Source for 0.10. mu.m Copper Applications", Journal of Vacuum Science and Technology, A 18(4) Jul./Aug. 2000 p. 1546.
Cohen et al., "Reactive Preclean Technology for Nonphysical Copper Oxide Reduction for Advanced CU Interconnect", Jun. 16-Jun. 18, 1998, VMIC Conference, pp. 91 and 93.
Jian Li and J.W. Mayer and E. G. Colgan, "Oxidation and Protection in Copper and Copper Alloy Thin Films", J. Appl. Phys. 70 (5), Sep. 1, 1991, pp. 2820-2827.
Ding et al., "Observation of Reduced Oxidation Rates for Plasma-Assisted CVD Copper Films", Mat. Res. Soc. Symp. Proc., vol. 309, 1993 pp. 445-460.
Klawuhn et al., "Ionized Physical-vapor deposition Using a Hollow-Cathode Magnetron Source for Advanced Metallization", J. Vac, Sci, Technol. A18(4), Jul./Aug. 2000, pp. 1546-1549.
M. Zinke-Allmang, "Phase Separation on Solid Surfaces: Nucleation, Coarsening and Coalescence Kinetics".
Peijun Ding, et al., "Copper Barrier, Seed Layer and Planarization Technologies," VMIC Conference, Jun. 10-12, 1997, pp. 87-92.
Tarek Suwwan de Felipe, et al., "Electrical Stability and Microstructural Evolution in Thin Films of High Conductivity Copper Alloys," IEEE, Jun. 1999, pp. 293-295.
Cho et al., "Factors Affecting Passivation and Resistivity of Cu(Mg) Alloy Film," Materials Research Society Symposium Proc. vol. 564, 1999, pp. 353-358.
Murarka et al., "Copper Metallization for ULSI and Beyond," Critical Reviews in Solid State and Materials Sciences, 1995, pp. 87-124.
Braeckelmann et al. "Integration and Reliability of Copper Magnesium Alloys for Multilevel Interconnects," IEEE, Feb. 2000, pp. 236-238.
Arcot et al., "Intermetallic Formation in Copper/Magnesium Thin Films—kinetics, Nucleation and Growth, and Effect of Interfacial Oxygen," J. Appl. Phys. 76(9), Nov. 1, 1994, pp. 5161-5170.
Ding et al., "Effects of the addition of small amounts of Al to copper: Corrosion, resistivity, adhesion, morphology, and diffusion," J. Appl. Phys. 75(7), Apr. 1994, pp. 3627-3631.
T. Suwwan de Felipe et al., "Bias-temperature stability of the Cu(Mg)/SiO.sub.2/p-Si metal-oxide-semiconductor capacitors," J. Vac. Sci. Technol. B 15(6), Nov./Dec. 1997, pp. 1987-1986.
Chen et al. "Low Temperature Plasma-Assisted Chemical Vapor Deposition of Tantalum Nitride form Tantalum Pentabromide for Copper Metallization," Jan./Feb. 1999, J. Vac. Sci. Technol., B 17(1), pp. 182-185.

Cheng et al., "Directional Deposition of Cu into Semiconductor Trench Structures Using Ionized Magnetron Sputtering," Mar./Apr. 1995, J. Vac. Sci. Technol., B 13(2), pp. 203-208.
Cho et al., "Remote Plasma-Assisted Metal Organic Chemical Vapor Deposition of Tantalum Nitride Thin Films with Different Radicals," Dec. 1998, Jpn. J. Appl. Phys., vol. 37.
Endle et al., "X-Ray Photoelectron Spectroscopy Study on TiN Films Produced with Tetrakis (dimethylamido)Titanium and Selected N-Containing Precursors on SiO.sub.2," May/Jun. 1998, J. Vac. Sci. Technol., A 16(3), pp. 1262-1267.
Green et al., "Determination of Flux Ionization Fraction Using a Quartz Crystal Microbalance and a Gridded Energy Analyzer in an Ionized Magnetron Sputtering System," Dec. 1997, Rev. Sci. Instrum., 68 (12), pp. 4555-4560.
Han et al., "Barrier Metal Properties of Amorphous Tantalum Nitride Thin Films Between Platnium and Silicon Deposited Using Remote Plasma Metal Organic Chemical Vapor Method," May 1998, Jpn. J. Appl. Phys., vol. 37 (1998), Pt. 1, No. 5A, pp. 2646-2651.
Hayden et al., "Characterization of Magnetron-Sputtered Partially Ionized Aluminum Deposition," Mar./Apr. 1998, J. Vac. Sci. Technol., A 16(2), pp. 624-627.
Hayden et al., "Helion Plasma Source for Ionized Physical Vapor Deposition," 1999, Surface and Coatings Technology, 120-121 (1999), pp. 401-404.
Lee et al., "The Failure Mechanism of MOCVD TiN Diffusion Barrier at High Temperature," 1996, Mat. Res. Soc. Symp. Proc., vol. 324, pp. 279-284.
Lucovsky et al., "Formation of Thin Fims by Remote Plasma Enhanced Chemical Vapor Deposition (Remote PECVD)," Feb. 1990, in Handbook of Plasma Processing Technology, eds. Rossnagel, Cuomo and Westwood, Noyes Publications, pp. 387-408.
Musher et al., Atmospheric Pressure Chemical Vapor Deposition of Titanium Nitride from Tetrakis (diethylamido) Titanium and Ammonia, Feb. 1996, J. Electochem. Soc., vol. 143, No. 2, pp. 736-744.
Peng et al., "Structural and Electrical Properties of Chemical Vapor Deposition Tungsten Overgrowth on Physical Vapor Deposited and Metalorganic Chemical Vapor Deposited TiN Adhesion Layers," Jul./Aug. 1998, J. Vac. Sci. Technol., B 16(4), pp. 2013-2018.
Reif, Rafael, Plasma Enhanced Chemical Vapor Deposition of Thin Films for Microelectronics, Feb. 1990, in Handbook of Plasma Processing Technology, eds: Rossnagel, Cuomo and Westwood, Noyes Publications, pp. 260-284.
Truong, C.M.; Chen, P.J.; Corneille, J.S.; Oh, W.S. and Goodman, D.W., "Low-Pressure Deposition of TiN Thin Films from a Tetrakis (diethylamido) Titanium Precursor," 1995, J. Phys. Chem., 1995, 99, pp. 8831-8842.
Tsai et al., "Comparison of the Diffusion Barrier Properties of Chemical-Vapor-Deposited TaN and Sputtered TaN Between Cu and Si," May 1996, J. Appl. Phys., 79 (9), pp. 6932-6938.
Danek et al., "Barrier First Method for Single Damascene Trench Applications," Novellus Systems, Inc., U.S. Appl. No. 11/714,465, filed Mar. 5, 2007.
U.S. Office Action mailed Jul. 31, 2002, from U.S. Appl. No. 09/862,539.
U.S. Office Action mailed Sep. 16, 2002, from U.S. Appl. No. 09/776,704.
U.S. Office Action mailed Apr. 22, 2002, from U.S. Appl. No. 09/776,704.
U.S. Final Office Action mailed Apr. 3, 2003, from U.S. Appl. No. 09/816,847.
U.S. Office Action mailed Oct. 4, 2002, from U.S. Appl. No. 09/816,847.
U.S. Office Action mailed Oct. 23, 2002, from U.S. Appl. No. 09/965,472.
U.S. Office Action mailed Oct. 3, 2003, from U.S. Appl. No. 10/412,562.
U.S. Final Office Action mailed Mar. 23, 2006, from U.S. Appl. No. 10/804,353.
U.S. Office Action mailed Oct. 3, 2006, from U.S. Appl. No. 10/804,353.
U.S. Office Action mailed Aug. 28, 2002, from U.S. Appl. No. 09/975,612.

U.S. Office Action mailed Jun. 15, 2004, from U.S. Appl. No. 10/289,237.

U.S. Office Action mailed Dec. 19, 2002, from U.S. Appl. No. 10/121,949.

Klawuhn et al., "Apparatus and Methods for Deposition and/or Etch Selectivity," Novellus Systems, Inc., U.S. Appl. No. 11/558,693, filed Nov. 10, 2006.

Dulkin et al., "Deposition of Thin Continuous PVD Seed Layers Having Improved Adhesion to the Barrier Layer," Novellus Systems, Inc., U.S. Appl. No. 11/473,618, filed Jun. 22, 2006.

Dulkin et al., "Method and Apparatus for Controlling Sputtered Flux in PVD Sources," Novellus Systems, Inc., U.S. Appl. No. 11/564,222, filed Nov. 28, 2006.

Kailasam et al., "Resputtering Process for Eliminating Dielectric Damage," Novellus Systems, Inc., U.S. Appl. No. 11/588,586, filed Oct. 26, 2006.

Lu et al., "An Integrated Plasma Equipment-feature Scale Model for Ionized Metal Physical Vapor Deposition", Jun. 2000, University of Illinois (16 pages).

Font et al., "Scaling of Hollow Cathode Magnetrons for Metal Deposition", Oct. 1999, University of Illinois (20 pages).

Rozbicki, R., "Methods and Apparatus for Resputtering Process that Improves Barrier Coverage," Novellus Systems, Inc., U.S. Appl. No. 11/830,777, filed Jul. 30, 2007.

Rozbicki et al., "Multistep Method of Depositing Metal Seed Layers," Novellus Systems, Inc., U.S. Appl. No. 11/701,984, filed Feb. 1, 2007.

Pradhan et al., "Atomic Layer Profiling of Diffusion Barrier and Metal See Layers," Novellus Systems, Inc., U.S. Appl. No. 11/807,179, filed May 24, 2007.

Juliano, D., "Selective Resputtering of Metal Seed Layers," Novellus Systems, Inc., U.S. Appl. No. 11/903,487, filed Sep. 21, 2007.

Vijayendran et al., "Gas Treatment Method and Apparatus to Improve Copper Gap Fill," U.S. Appl. No. 11/131,599, filed May 18, 2005.

Vyvoda et al., "Role of sidewall scattering in featuring profile evolution during $Cl_2$ and HBr plasma etching of silicon," J.Vac. Sci. Technol. B 18(2), Mar./Apr. 2000, pp. 820-833.

Hoekstra et al., "Microtenching resulting from specular reflection during chlorine etching of silicon," J.Vac. Sci. Technol. B 16(4), Jul./Aug. 1998, pp. 2102-2104.

Lane et al., "Feature evolution during plasma etching. II. Polycrystalline silicone etching," J.Vac. Sci. Technol. A 18(1), Jan./Feb. 2000, pp. 188-196.

Rozbicki R., "A Method of Enhancing Selectivity of Resputtering Process," Novellus Systems, Inc., U.S. Appl. No. 11/977,355, filed Oct. 23, 2007.

Kinder et al., "The Use of Ultra-High Magnetic Fields in Resputter and Plasma Etching," Novellus Systems, Inc., U.S. Appl. No. 11/807,183, filed May 24, 2007.

Dulkin et al., "Methods and Apparatus for Engineering and Interface Between A Diffusion Barrier Layer and A Seed Layer," Novellus Systems, Inc., U.S. Appl. No. 11/807,178, filed May 24, 2007.

Wu et al., "Deposition of Doped Copper Seed Layers Having Improved Reliability," Novellus Systems, Inc., U.S. Appl. No. 12/122,118, filed May 16, 2008.

U.S. Office Action mailed Jun. 26, 2008, from U.S. Appl. No. 11/473,618.

U.S. Office Action mailed May 2, 2008, from U.S. Appl. No. 11/558,693.

U.S. Office Action mailed Dec. 12, 2008, from U.S. Appl. No. 11/714,465.

Notice of Allowance and Fee Due mailed Nov. 24, 2008, from U.S. Appl. No. 11/558,693.

Allowed Claims from U.S. Appl. No. 11/558,693.

U.S. Final Office Action mailed Dec. 10, 2008, from U.S. Appl. No. 11/473,618.

U.S. Office Action mailed Nov. 14, 2008, from U.S. Appl. No. 11/701,984.

Notice of Allowance and Fee Due mailed Apr. 13, 2004, from U.S. Appl. No. 10/412,562.

Allowed Claims from U.S. Appl. No. 10/412,562.

Notice of Allowance and Fee Due mailed Oct. 3, 2006, from U.S. Appl. No. 10/804,353.

Allowed Claims from U.S. Appl. No. 10/804,353.

Wu et al., "Methods and Apparatus for Depositing Titanium Based Diffusion Barrier Films," Novellus Systems, Inc., U.S. Appl. No. 12/154,984, filed May 28, 2008.

U.S. Office Action mailed on Mar. 6, 2009 for U.S. Appl. No. 11/903,487.

U.S. Office Action mailed on Feb. 23, 2009 for U.S. Appl. No. 11/701,984.

U.S. Office Action mailed on Mar. 24, 2009 for U.S. Appl. No. 11/473,618.

U.S. Office Action mailed on May 5, 2009 for U.S. Appl. No. 11/588,586.

U.S. Office Action mailed on May 26, 2009 for U.S. Appl. No. 11/564,222.

U.S. Final Office Action mailed Jun. 17, 2009 for U.S. Appl. No. 11/701,984.

U.S. Office Action mailed Aug. 3, 2009 for U.S. Appl. No. 11/714,465.

Shaviv et al., "Conformal Films on Semiconductor Substrates" Novellus Systems, Inc., U.S. Appl. No. 12/467,200, filed May 15, 2009.

U.S. Office Action mailed Jul. 23, 2009 for U.S. Appl. No. 12/122,118.

Notice of Allowance, mailed Sep. 18, 2009 for U.S. Appl. No. 11/903,487.

U.S. Office Action for U.S. Appl. No. 12/154,984, mailed Oct. 6, 2009.

D'Couto et al. J. Vac. Sci. Technol. B. 2001, 19(1), pp. 244-249.

Notice of Allowance, mailed Nov. 9, 2009 for U.S. Appl. No. 11/701,984.

U.S. Final Office Action for U.S. Appl. No. 11/588,586 mailed Nov. 4, 2009.

Rozbicki et al., "Multistep Method of Depositing Metal Seed Layers" Novellus Systems, Inc., U.S. Appl. No. 12/699,738, filed Feb. 3, 2010.

U.S. Office Action mailed Feb. 4, 2010 for U.S. Appl. No. 11/807,179.

U.S. Office Action mailed Mar. 5, 2010 for U.S. Appl. No. 11/807,178.

U.S. Notice of Allowance and Allowed Claims, mailed Mar. 8, 2010 for U.S. Appl. No. 11/714,465.

U.S. Final Office Action mailed Mar. 11, 2010 for U.S. Appl. No. 12/122,118.

U.S. Final Office Action mailed Apr. 15, 2010 for U.S. Appl. No. 12/154,984.

U.S. Office Action mailed May 12, 2010 for U.S. Appl. No. 11/807,183.

\* cited by examiner

METHOD AND APPARATUS FOR INCREASING LOCAL PLASMA DENSITY IN MAGNETICALLY CONFINED PLASMA

FIELD OF THE INVENTION

The present invention pertains to methods and apparatus for increasing local plasma density in magnetically confined plasma. In particular, the present invention pertains to plasma physical vapor deposition and sputter etching. The methods are particularly useful for sputter etching diffusion barrier layers and copper seed layers. The methods can also be applied for sputter etch back of other wafer materials, such as conductive lines.

BACKGROUND OF THE INVENTION

Miniaturization of integrated circuit (IC) devices demands superior electrical properties from both dielectric and conductive materials used in the manufacturing of an integrated circuit. Copper, due to its lower resistivity, has replaced aluminum as a conducting material in many IC applications, while dielectric materials with low dielectric constant (low-k and ultra low-k dielectrics) have replaced the traditionally used silicon dioxide as an inter-layer dielectric (ILD) material. The low-k dielectric materials now used in the IC device processing include carbon doped silicon dioxide, hydrogenated silicon oxycarbides (SiCOH), fluorine doped silicon dioxide, and organic-containing low-k dielectrics. These materials, due to their low dielectric constants, provide low parasitic capacitance and minimize the "crosstalk" between the interconnects in an integrated circuit. At the same time, they are often porous foam-like materials and are generally more easily damaged during the processing steps compared to more robust silicon dioxide.

Currently used IC fabrication processes often include operations that remove or redistribute material on a wafer surface using ions generated in a plasma. These operations are often referred to as sputter etching or resputtering. In such methods, positively charged inert gas ions or metal ions impinge on a negatively biased substrate, removing or redistributing portions of exposed material residing on a wafer substrate. Examples of materials that can be removed or redistributed using sputter etching and resputtering include diffusion barrier materials (e.g., Ta and $TaN_x$), and seed layer materials, such as copper and its alloys. These materials typically coat the layer of low-k dielectric material, which is not exposed to plasma during material redistribution.

SUMMARY OF THE INVENTION

With an ongoing miniaturization of IC devices, especially with processing of devices at a 65 nm technology node and at more advanced nodes, it became more challenging to perform resputtering without exposing dielectric layers to plasma. It was noted that a layer of dielectric can become exposed during resputter, especially when large amounts of diffusion barrier or other material are removed from the wafer substrate. When resputtering is performed under conventional conditions, the exposed dielectric material can easily become damaged by high-energy ions that impinge upon it. One type of such damage is microtrenching, which manifests itself in increased dielectric etching at particular locations within the recessed features of the wafer. In one typical example, microtrenches are formed in the proximity of the sidewalls in the bottom portions of the recessed features, e.g., in the trench bottoms. Microtrenching leads to decreased reliability of the formed IC devices due to reduced adhesion of the subsequently deposited layers. Further, microtrenching contributes to an increase in line-to-line leakage due to local increase in current densities in the microtrenches. It was therefore recognized that there is a need for a resputtering method that would remove material from the wafer surface without causing microtrenching in the exposed dielectric layer.

Efficient resputtering of diffusion barrier layers in the presence of exposed dielectric can be achieved when higher density plasma is employed. Microtrenching can be substantially eliminated when resputtering is performed using a high flux of low energy ions at the wafer surface. For example, an ion flux of at least about $5 \cdot 10^{15}$ ions/cm²s, preferably of at least about $10^{16}$ ions/cm²s, having a mean energy of less than about 250 eV, preferably less than about 200 eV, e.g., less than about 150 eV is effective for diffusion barrier material etching without causing microtrenching in many types of low-k dielectrics. It is understood that different types of dielectric materials may have different susceptibility to plasma damage, and that lower energy plasma may be needed to avoid microtrenching in more delicate dielectrics, while higher energy plasma may be tolerated by more robust dielectric materials. Without being bound by a particular theory of operation, it is believed that lower kinetic energy of the ions contacting the wafer leads to decreased dielectric damage, while the higher density of ion flux increases the etch rate and maximizes resputtering efficiency.

High ion flux of low-energy ions can be produced in one embodiment by generating a high-density low ion energy plasma proximate the wafer substrate. Conventionally, generation of plasma having a density of greater than about $10^{11}$ electrons/cm³ proximate the wafer substrate, proved to be difficult to achieve. Therefore, high ion fluxes needed for resputtering in low energy regime, could not be easily attained. Further, as higher density plasmas were generated, the radial uniformity of an ion flux across the wafer diminished, resulting in higher rates of material removal at the center of the wafer compared to wafer edges. It was recognized that new methods and apparatus for increasing local plasma density and for improving plasma uniformity were needed.

According to some embodiments presented herein, plasma density of at least about $5 \cdot 10^{11}$ electrons/cm³ (or ions/cm³), preferably at least about $10^{12}$ electrons/cm³ and, in some cases, as high as at least about $10^{13}$ electrons/cm³ is achieved in the vicinity of the wafer surface (e.g., within about 3 cm of the wafer surface, such as within 1 cm of the wafer surface). Increased ion flux provided by such plasma achieves efficient etching of diffusion barrier or other material, even when the kinetic energy of ions in the plasma is relatively low.

Further, efficient resputtering with high density plasma with a non-uniformity across the wafer of less than about 10%, and in some cases less than about 3% can be achieved using methods provided herein.

While methods and apparatus described herein address the microtrenching problem by providing high density low energy plasmas at the wafer surface, the described methods and apparatus are not limited to this particular application. In general, these methods can be used for increasing local plasma density in a variety of processes, including both resputtering (in a low energy and high energy regimes) and deposition. While provided methods are particularly suitable for resputtering in a low-energy regime, in those instances when dielectric is not exposed during resputtering, higher energy plasmas may be used to increase the etching rates. In yet other embodiments provided methods may be used for depositing diffusion barrier and seed layer materials. When high density low ion energy plasmas are used during deposition, the quality of deposited films can improve, due to decreased incorporation of inert gas ions into deposited films. In yet other embodiments provided methods are used to generate plasmas, that do not necessarily have high density, but have higher density than they would otherwise have in a conventional apparatus.

Provided methods can be used to increase the efficiency of resputter (thereby resulting in increased throughput) by increasing resputter etch rates. For example high etch rate to deposition rate (E/D) ratios (e.g., E/D of at least about 2, at least about 4, and at least about 10) can be achieved when high ion flux is generated in the vicinity of the wafer. Further, provided methods achieve improved etch-back non uniformity (EBNU) by increasing the plasma density at the outer portion of the wafer.

The methods can be practiced in any type of an apparatus that provides at least one region of magnetically shaped or confined plasma. Examples of such apparatus include PVD process chambers, such as process chambers comprising a planar magnetron or a hollow cathode magnetron (HCM). In some embodiments, it is preferred to use the described methods in an apparatus that provides two regions of magnetically shaped or confined plasma. In some embodiments, the provided methods are practiced in an apparatus that does not make use of an inductively coupled plasma (ICP), e.g., in an apparatus that uses only capacitively coupled plasma. In other embodiments, provided methods can be used in an apparatus that produces remotely or internally generated ICP.

One aspect of the invention pertains to methods of increasing local plasma density in an apparatus. For example, the methods can be used to obtain high density plasma in the vicinity of the wafer. A local plasma density is increased by providing an ion extractor configured to transfer ions and electrons from a first region of magnetically confined plasma (typically a region of higher density plasma, which will be referred to as "donor plasma") to a second region of plasma (typically a region of lower density plasma, which will be referred to as an "acceptor plasma"). The second region of plasma is preferably also magnetically shaped or confined and resides between the first region of plasma and the substrate. In one embodiment, the acceptor region of plasma resides proximate the substrate, e.g., within about 3 cm from the substrate, while the donor region of plasma resides farther away, e.g., at least about 15 cm from the substrate. A positively biased conductive member positioned proximate the second region of plasma serves as an ion extractor. It was an unexpected finding that a positive, rather than a negative bias, applied to an ion extractor, increases the density of plasma comprising positively charged ions. In one embodiment, a positive bias of at least about 30 V, preferably about 50-300 V is applied to the ion extractor causing electrons to be transferred from the first region of plasma to the second region of plasma, which, in turn, causes an increase in positive ion density in the second region of plasma.

In one embodiment, a method of generating a high density plasma in the vicinity of a substrate includes the following operations. The wafer substrate (e.g., a substrate having recessed features and a layer of diffusion barrier and/or seed layer material disposed thereon) is first positioned within the process chamber, which is configured for plasma generation. For example a plasma PVD chamber comprising a metal target is used. The plasma comprising electrons and positively charged ions (e.g., inert gas ions and/or metal ions) is then generated. The plasma has a first plasma density at a first elevation above the substrate and is, preferably, magnetically shaped or confined at the first elevation. The plasma has a second plasma density at a second elevation above the substrate, the second elevation being closer to the substrate than the first elevation. In some embodiments, the plasma is also magnetically shaped or confined at the second elevation. In one embodiment, the region of the first plasma density and the region of the second plasma density are separated by a null magnetic field. An ion extractor is used to transfer increase plasma density at the second elevation (in the region of acceptor plasma). The ion extractor, in one embodiment, is an electrically conductive member circumferentially positioned proximate the second elevation. A sufficient positive bias is applied to the ion extractor, to extract electrons from the region of the first plasma density to the region of the second plasma density and to maintain a high plasma density in the second plasma region, and, consequently, to maintain a high plasma density proximate the substrate (e.g., within about 1-3 cm from the substrate).

The ion extractor can have a variety of shapes, e.g., it can have a hollow cylindrical shape or a ring shape. The ion extractor is electrically isolated from other components of the chamber and is electrically connected to an ion extractor power supply, positioned outside of the chamber. In one embodiment, the ion extractor is an aluminum shield, isolated from the chamber sidewalls with the use ceramic rings. A DC, RF or AC positive bias can be applied to the ion extractor by the power supply. In one implementation, the use of DC bias is preferred. The magnitude of applied bias can range widely, depending on the particular process that needs to be implemented, and the density of plasma that needs to be achieved. In some embodiments, a bias of at least about 30 V, preferably at least about 50 V is sufficient to effect an increase in plasma density in the proximity of a substrate.

The provided methods can be used to increase plasma density of low, moderate and high density plasma. For example, the plasma density in the first plasma region can range from about $10^8$-$10^{13}$ electrons/cm$^3$. Conventionally, the second plasma region will have a lower plasma density, e.g., a plasma density of about $10^7$-$10^{11}$ electrons/cm$^3$. By the use of ion extractor methods provided herein, the plasma density in the second plasma region can be increased at least about twice, preferably at least about 5-fold, and, in some embodiments, at least about 10-fold. Thus, in some embodiments, local plasma density in the second plasma region can be increased to about $10^{12}$, and even $10^{13}$ electrons/cm$^3$ and can be maintained at this level.

In one embodiment an ultra-high density plasma is formed in the first plasma region. For example, a plasma having a density of at least about $10^{13}$ electrons/cm$^3$, can be formed using plasma confinement with an ultra-high magnetic field. In one embodiment, a magnetic field of at least about 1 Tesla is used to confine the plasma in the first plasma region forming an ultra-high density highly confined plasma. When positive bias is applied to the ion extractor located proximate the second region of plasma, the ions are extracted from the region of ultra-high plasma density to the second region of plasma, increasing the plasma density in the second region, e.g., to a density of at least about $10^{12}$ electrons/cm$^3$ and even $10^{13}$ electrons/cm$^3$.

In one embodiment, electrons extracted into the second region of plasma acquire sufficient energy to cause further ionization of the process gas in the second region of plasma. Thus, the plasma density is increased not only by electron and ion transfer, but by an additional ionization pathway.

In those embodiments, where the plasma in the second plasma region is further magnetically confined, it is often preferable to increase plasma density in the second plasma region using a combination of electric and magnetic fields. In one embodiment the E vector (characterizing the electric field generated by the positively biased ion extractor) and the B vector (characterizing the magnetic field in the second plasma confinement region) are substantially orthogonal at least at one location. The generated electromagnetic forces further accelerate the trapped electrons in this region and produce a region of higher density plasma. In one implementation, the formed plasma is toroidally shaped above the wafer, and contributes to non-uniformity improvement at the wafer edges.

Another aspect of the invention pertains to an apparatus for processing material on a semiconductor wafer. The apparatus can be used for depositing, removing and redistributing layers of material on the wafer. The apparatus includes a process chamber having an inlet for introduction of an inert gas, a target (e.g., a planar or a three-dimensional target) disposed within the process chamber and configured to accept a negative bias, and a wafer support for holding the wafer in position during processing of the material, and, optionally, configured to accept a negative bias. The apparatus further includes a first magnetic field source configured to generate a first electromagnetic field capable of shaping or confining a plasma in a first plasma region at a first elevation above the wafer support, a second magnetic field source configured to generate a second electromagnetic field capable of shaping or confining a plasma in a second plasma region at a second elevation above the wafer support, the second elevation being closer to the wafer support than the first elevation. The apparatus further includes an ion extractor positioned within the process chamber proximate the second elevation and configured to increase the plasma density at the second elevation by transferring electrons generated in the first plasma region to the second plasma region. The ion extractor is, in one embodiment, a circumferentially positioned conductive member configured to accept a positive bias. The ion extractor is electrically isolated from other chamber components and is electrically connected to an ion extractor power supply. The power supply can be configured to provide a DC, a pulsed DC, RF, or AC bias of, e.g., at least about 30V, preferably at least about 50 V, e.g., between about 50-300 V. In some embodiments, a DC power supply is preferred.

The magnetic field sources may include electromagnets, permanent magnets, and, in some cases, coils configured for generation of ICP. In one embodiment, the provided apparatus does not make use of an ICP. In a particular embodiment, at least one electromagnet is used to confine the plasma in the first plasma region, and at least one electromagnet is used to shape plasma in the second plasma region. The first magnetic field source is, in some embodiments, configured to generate a stronger magnetic field than the second magnetic field source. The field strength, generated by the first magnetic field source can range between about 0.1-1.5 Tesla in the proximity of the target. In one embodiment, the first electromagnetic field source is configured to generate an ultra-high magnetic field of at least about 1 Tesla, giving rise to an ultra-high density plasma in the region of donor plasma.

The provided apparatus can further include a controller comprising program instructions for implementing methods described herein. For example, the instructions may specify parameters for generating a plasma having a first plasma density in a first plasma region at a first elevation above a substrate and a second plasma density in a second plasma region at a second elevation closer to the substrate; and applying a positive bias to the ion extractor to transfer the electrons from the first plasma region to the second plasma region.

These and other features and advantages of the present invention will be described in more detail below with reference to the associated drawings.

DETAILED DESCRIPTION OF PREFERRED EMBODIMENTS

Introduction and Terminology

Figure 1A:
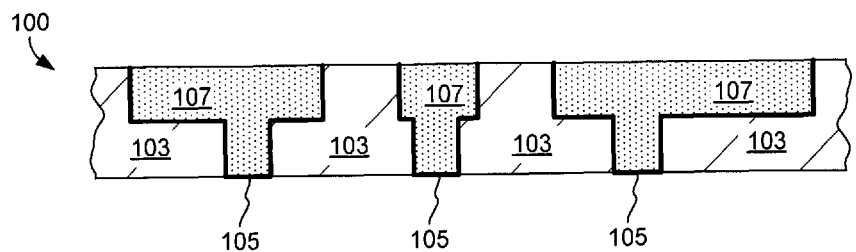
FIGS. 1A-1H show cross sectional depictions of device structures created during a copper dual Damascene fabrication process.

As mentioned, methods and apparatus for increasing local plasma density (e.g., plasma density proximate the substrate in a process chamber) are herein provided. The methods can be used, for example, in PVD and plasma pre-clean reactors that have at least one region of magnetically confined or shaped plasma. A greater than about two-fold, a five-fold and, in some embodiments, a ten-fold increase in local plasma density can be achieved by implementing provided methods. In some embodiments, provided methods are used to generate a high density plasma (e.g., a plasma having a density of at least about $10^{11}$ electrons/$cm^3$, preferably at least about $10^{12}$ electrons/$cm^3$ and in some cases at least about $10^{13}$ electrons/$cm^3$) proximate the semiconductor wafer substrate, however the methods are not limited that way. For example, medium and low density plasmas may also be formed by increasing the density of even lower density plasmas.

Provided methods also increase radial plasma uniformity in the proximity of a substrate. "Proximity of a substrate"

refers to a region adjacent the wafer substrate, typically a region within 1-3 cm of a substrate.

In some embodiments, the formed plasmas are used to remove material from the semiconductor wafer surface in a resputtering operation. "Resputtering" is herein defined as a plasma-based material removal and redistribution method in which net material removal occurs at least at one location on a wafer substrate, e.g., at a recess bottom. Resputtering can be integrated into the process flows for deposition of diffusion barrier and seed layer, and is typically used in conjunction with depositing operations to achieve conformal coverage of a substrate with deposited material. Resputtering can be used, for example, to redistribute material from via bottoms to via sidewalls, to remove or reshape overhang at the openings of recessed features, to clean via bottoms, and to form anchor recesses. Resputtering can be performed in a PVD process chamber (a chamber having a sputter target) or in a plasma pre-clean chamber (a chamber without a sputter target). In those embodiments when resputtering is performed in a PVD chamber, etching and deposition are typically occurring simultaneously on a substrate. Etching is effected by the inert gas ions and, in some cases, by metal ions, impinging on the wafer with a sufficient momentum to dislodge the exposed material, while deposition is effected by neutral metal atoms being sputtered onto the wafer from the metal target and, in some cases, by metal ions, created in the plasma. When an intrinsic etch rate E is greater than an intrinsic deposition rate D, a net etching process is occurring on the wafer surface. When the etch rate E is smaller than the deposition rate D, the process is characterized as a net deposition. Intrinsic etch rate can be increased by increasing the negative bias applied to the wafer. When high negative bias is applied to the wafer, the positively charged ions impinging on the wafer surface acquire high kinetic energy, which allows them to easily dislodge material from the wafer surface. However, it was herein recognized that operation at a high negative bias applied to the wafer ("high energy resputter"), also leads to formation of microtrenches in an exposed dielectric. In one embodiment, an efficient resputtering method using low negative bias at the wafer ("low energy resputter") and high plasma density will be provided.

An etch rate to deposition rate (E/D) ratio is often used to characterize the resputtering and deposition processes. At the E/D ratio of 1, no net deposition or etching is occurring. At the E/D ratio of 0, the process is entirely depositing. At E/D ratios of greater than 1 etching predominates, this being characteristic of resputter. The E/D ratio is not necessarily the same in different features of the wafer. For example, the E/D ratio in the field, in the trench, and in the via may have different values. For example, it is possible to have net deposition in the field region (E/D<1) and net etch at the via bottom (E/D>1). The resputtering process can be described as a process that provides an E/D>1 at least at one location on the wafer, e.g., at a via bottom, at the lowest lying feature on the wafer or in some cases in the feature having the highest aspect ratio. The fact that a net deposition is occurring at a different location on the wafer, e.g., in the field, does not change the fact that resputtering is performed. An E/D ratio can be modulated by modulating the process parameters, such as the DC power applied to the sputter target and the RF power applied to the wafer. However, it is often difficult to obtain high E/D ratios using such modulation. Conventionally, E/D ratios of only less than about 4 were obtained. While for many applications such E/D ratios were acceptable, it was herein recognized that it is often preferable to resputter in a high E/D regime, in order to increase throughput and minimize unwanted material deposition. High density plasmas, residing proximate the wafer substrate can achieve significantly more efficient material removal than previously used methods. For example, E/D ratios of greater than about 4, e.g., greater than about 10 can be obtained, using provided methods.

Further, it was herein recognized, that conventional modulation of parameters often could not provide for efficient resputtering of metal-containing material in the presence of exposed dielectric. Conventionally used conditions typically would lead to dielectric material damage, such as microtrenching. It is herein provided that high density low energy plasma, described herein can be used to avoid this problem.

Provided methods can be used to resputter a variety of materials, e.g., diffusion barrier materials, seed layer materials, metal line materials and the like. Examples of diffusion barrier materials include Ta, $TaN_x$, $Ta_xSi_yN_z$, Ti, $TiN_x$, $Ti_xSi_yN_z$, W, $WN_x$, $W_xSi_yN_z$ $Ti_xSi_yN_z$, Mo, $MoN_x$, $Mo_xSi_yN_z$, Ru, and Co. Most commonly used barrier materials include Ta, $TaN_x$, Ti, $TiN_x$, W, $WN_x$, Ru, and Co, of which $Ta/TaN_x$ bi-layers are preferred in some embodiments. Examples of seed layer materials to which provided methods apply include but are not limited to Cu, Ni, Ag, Au, Al, Pt and their alloys, of which copper metal and copper alloys are often preferred. For example, alloys of Cu with Al, Mn, Mg, Sn, Zn, B, and with other alloying materials known to those of skill in the art, can be resputtered according to provided methods. In some embodiments, the resputtered material can serve both as a barrier and as a seed layer, e.g., a CuMg or CuMn alloy, Ru, and the like. Commonly, these methods can also be applied to metal line etch-back, e.g., in an anchor-forming process. For example, a top portion of a copper or aluminum line underlying a via can be etched using provided methods, thereby forming an anchor recess.

In a particular embodiment, provided methods are used for removal of metal-containing material (e.g., diffusion barrier material or metal line material) in the presence of an exposed layer of dielectric. For example, an exposed layer of a low-k (k<3.5), or an ultra low-k (k<2.5) dielectric material may be present on the wafer surface (e.g., on the bottom portions of the recessed features) during resputter. Conditions are herein provided that achieve efficient resputtering without causing substantial damage (e.g., microtrenching) in a dielectric layer. For example, resputtering in the presence of an exposed dielectric with an E/D ratio of at least about 1.5, preferably of at least about 2 at a recess bottom can be performed.

In other embodiments provided methods are used in a deposition context. For example, high density plasmas formed in accordance with provided methods can be used to deposit diffusion barrier and seed layer materials. Deposition using high density plasmas, in some embodiments, results in improved quality of deposited films, due to decreased incorporation of inert gas ions into the deposited layers and/or due to high fraction of the metal ions in the deposition flux. Deposition, as used herein, refers to net deposition at least at one location on the semiconductor substrate, e.g., in the field region.

In order to frame the context of this invention, a brief description of a copper dual Damascene process for forming a partially fabricated integrated circuit is described below. The presented methods are not limited to a dual Damascene process and can be used in other processing methods, e.g., in single Damascene processing. Further, provided methods and apparatus can be used in applications outside of IC fabrication.

Presented in FIGS. 1A-1G, is a cross sectional depiction of device structures created at various stages of a dual Damascene fabrication process. A cross sectional depiction of a completed structure created by the dual Damascene process is shown in FIG. 1H. Referring to FIG. 1A, an example of a typical substrate, 100, used for dual Damascene fabrication is illustrated. Substrate 100 includes a pre-formed dielectric layer 103 (such as fluorine or carbon doped silicon dioxide or organic-containing low-k material) with etched line paths (trenches and vias) in which a diffusion barrier 105 has been deposited followed by inlaying with copper conductive routes 107. Because copper or other mobile conductive material provides the conductive paths of the semiconductor wafer, the underlying silicon devices must be protected from metal ions (e.g., $Cu^{2+}$) that might otherwise diffuse or drift into the silicon. Suitable materials for diffusion barrier 105 include tantalum, tantalum nitride, and the like. In a typical process, barrier 105 is formed by a physical vapor deposition (PVD) process such as sputtering, a chemical vapor deposition (CVD) process, or an atomic layer deposition (ALD) process. Resputtering and depositing methods described herein can be integrated into the deposition process flow for the barrier layer 105.

Typical metals for the conductive routes are aluminum and copper. More frequently, copper serves as the metal in Damascene processes, as depicted in these figures. The metal lines 107 are typically deposited by electrofill methods onto a thin layer of pre-deposited seed layer (not shown). The seed layer is usually deposited by PVD and can be formed, in some embodiments, using resputtering and depositing methods provided herein. After fill of metal layer 107 (above the field) the excess metal is removed to the field level (as well as portions of diffusion barrier 105 on the field). This leaves metal inlay 107 exposed on the field region for construction of additional layers. The resultant partially fabricated integrated circuit 100 is a representative substrate for subsequent Damascene processing, as depicted in FIGS. 1B-1G.

Figure 1B:
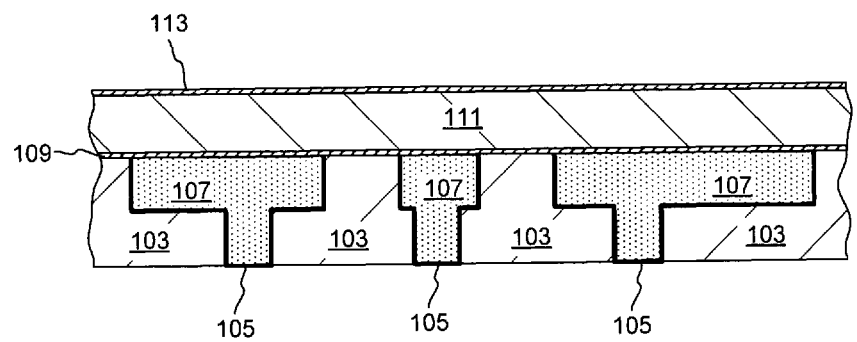

As depicted in FIG. 1B, a silicon nitride or silicon carbide diffusion barrier 109 is deposited to encapsulate conductive routes 107. Next, a first dielectric layer, 111, of a dual Damascene dielectric structure is deposited on diffusion barrier 109. The dielectric 111 is typically a low-k dielectric, such as described above for the layer 103. This is followed by deposition of an etch-stop layer 113 (typically composed of silicon nitride or silicon carbide) on the first dielectric layer 111. Layers 109, 111, and 113 can be deposited by CVD and plasma enhanced CVD (PECVD) methods from a variety of silicon, oxygen, carbon, and nitrogen containing precursors.

Figure 1C:
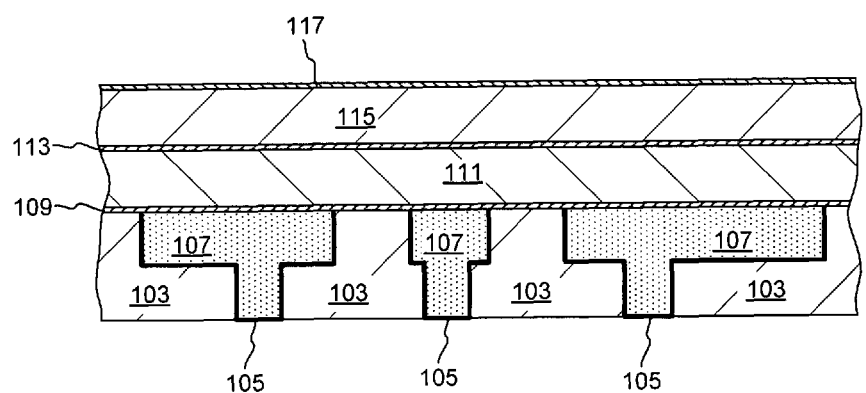

The process follows, as depicted in FIG. 1C, where a second dielectric layer 115 of the dual Damascene dielectric structure is deposited in a similar manner to the first dielectric layer 111, onto etch-stop layer 113. Deposition of an antireflective layer 117, typically containing BARC materials, follows.

Figure 1D:
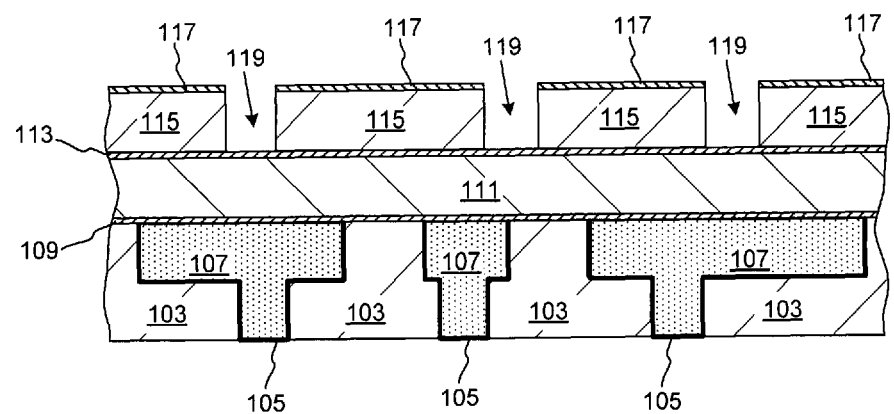
Figure 1E:
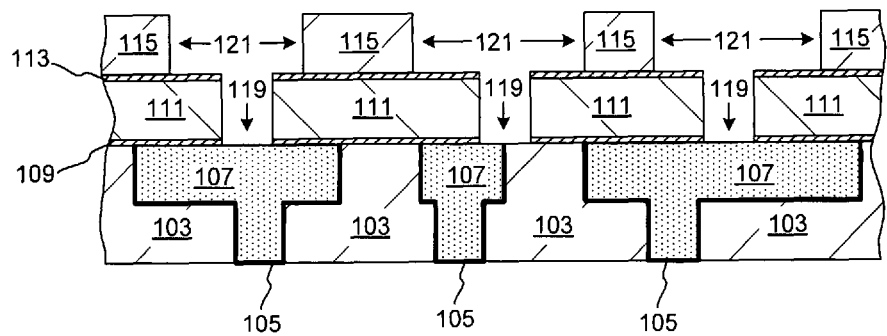

The dual Damascene process continues, as depicted in FIGS. 1D-1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Figure 1F:
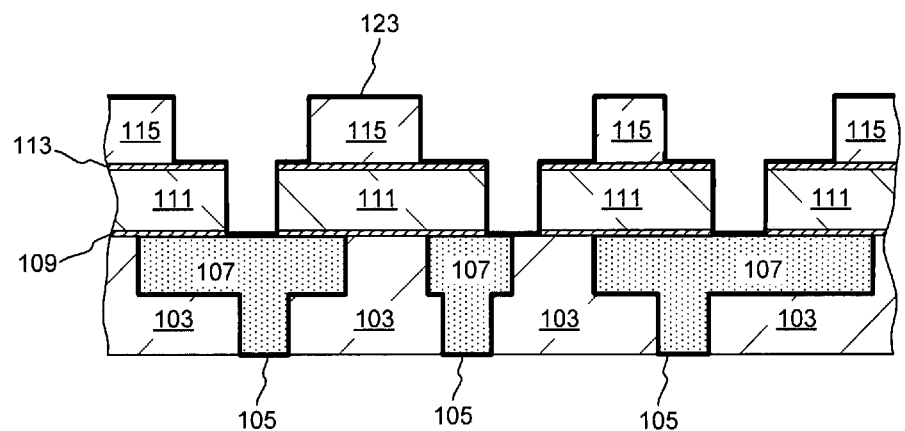

Next, as depicted in FIG. 1F, these newly formed vias and trenches are, as described above, coated with a diffusion barrier 123. The barrier 123 is made of tantalum, or other materials that effectively block diffusion of copper atoms into the dielectric layers. The methods provided herein can be integrated into deposition process flows for a diffusion barrier 123. Example deposition process flows that can make use of the methods provided herein are described in detail in U.S. Pat. No. 6,607,971, issued Aug. 19, 2003 naming Rozbicki et al as inventors, U.S. Pat. No. 6,764,940, issued Jul. 4, 2004 naming Rozbicki et al. as inventors, U.S. Pat. No. 7,186,648, issued Mar. 6, 2007 naming Rozbicki et al. as inventors, and in U.S. patent application Ser. No. 11/588,586, filed Oct. 26, 2006 naming Kailasam et al as inventors. U.S. Pat. Nos. 6,607,971, 6,764,940, 7,186,648, and the U.S. patent application Ser. No. 11/588,586 are herein incorporated by reference in their entireties and for all purposes.

An anchoring process that involves removing a portion of metal from underlying metal lines 107 in conjunction with barrier layer deposition is often performed to increase the reliability of formed interconnects. This process will be described in detail in the following sections.

After diffusion barrier 123 is deposited, a seed layer of copper is applied (typically by a PVD process) to enable subsequent electrofilling of the features with copper inlay. It is understood, that for certain seed layers, such as for certain copper alloys, diffusion barrier 123 may not be required. Such seed layers may themselves possess diffusion barrier properties and may be deposited directly onto a dielectric 115 and 111.

Figure 1G:
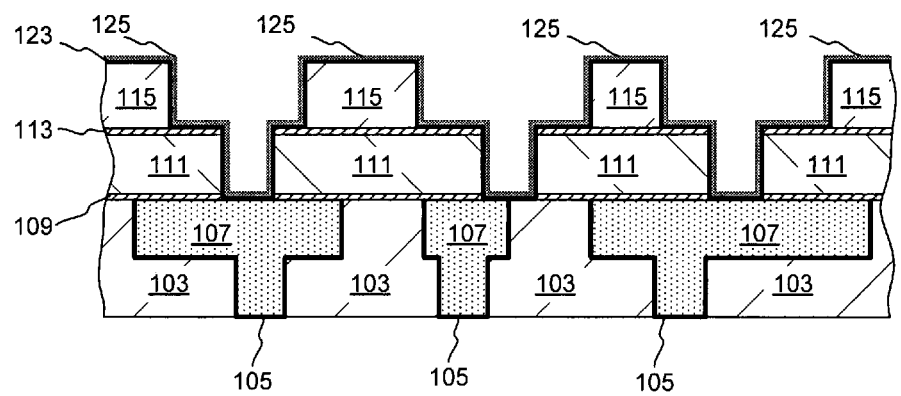
Figure 1H:
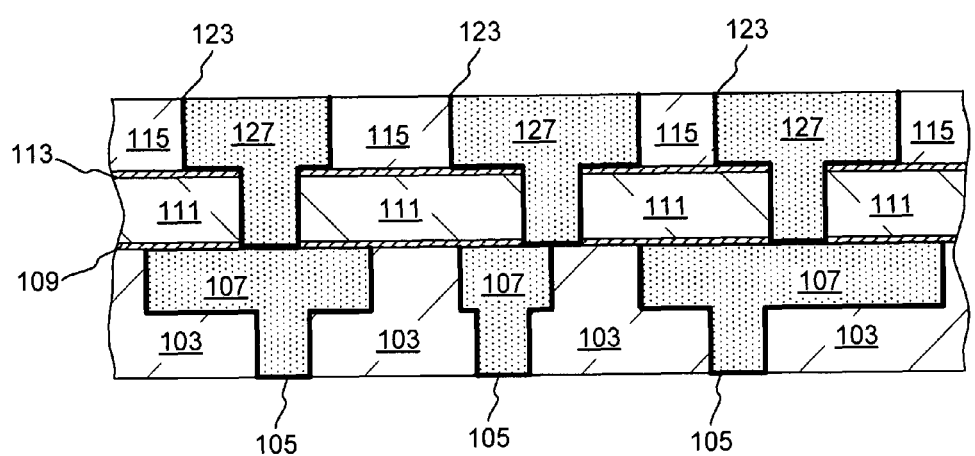

FIG. 1G depicts a copper seed layer 125 deposited on top of the diffusion barrier layer 123. The seed layer should preferably be continuous and should conformally coat the recessed features in order to support an electrofill process. Preferably, thickness of seed layer coverage should not significantly fluctuate depending on its position on the wafer. The resputtering methods described herein can be integrated into deposition process flows for a seed layer 125. Example deposition process flows that can make use of the methods provided herein are described in detail in the U.S. Pat. No. 6,642,146, issued Nov. 4, 2003 naming Rozbicki et al as inventors, and in the U.S. patent application Ser. No. 11/701,984, filed Feb. 1, 2007, naming Rozbicki et al. as inventors, which are herein incorporated by reference in their entireties and for all purposes.

After the seed layer has been deposited, the recesses are electrofilled with copper. During electrodeposition of copper, the seed layer residing on the wafer serves as a cathode with an electrical contact being made at the edge of the wafer.

After copper has been electrodeposited, excess copper is removed from the field by, for example, chemical mechanical polishing (CMP). FIG. 1H shows the completed dual Damascene structure, in which copper conductive routes 127 are inlayed (seed layer not depicted) into the via and trench surfaces over the barrier 123.

Copper routes 127 and 107 are now in electrical contact and form conductive pathways, as they are separated only by diffusion barrier 123, which is also somewhat conductive.

The methods provided herein can be used in resputter and deposition operations integrated into the deposition processes for diffusion barrier layers, such as layers 103 and 123; and copper seed layers, such as layer 125. They can be also used for via bottom pre-cleaning, and for forming anchor recesses in metal lines. Several embodiments of an inventive apparatus suitable for depositing and resputtering will now be illustrated.

Apparatus

Conventional process chambers used for plasma PVD, resputtering, and plasma pre-cleaning often have regions of different plasma density within the chamber. Typically, such tools produce a plasma that has a high density at a certain elevation above the wafer substrate, e.g., in the proximity of a metal target in a PVD chamber and a lower plasma density in the proximity of the wafer. For example, in an HCM, a plasma density of about $10^{12}$-$10^{13}$ electrons/cm$^3$ can be achieved within the magnetically confined region inside a cup-shaped target, while a lower plasma density of about $10^{11}$ electrons/cm$^3$ exists in the proximity of the wafer substrate. Conventionally, plasma density of about $10^{10}$ electrons/cm$^3$ proximate the substrate was considered to be sufficient for most PVD and resputtering applications.

It was herein recognized that resputtering under conventional conditions often results in low etching rates, and, in those cases when a dielectric layer is exposed during resputter, dielectric microtrenching readily occurs. As the dimensions of the recessed features are becoming smaller with an ongoing miniaturization of IC devices, the microtrenching problem becomes more pronounced. At a 65 nm technology node and at more advanced nodes, resputtering operations often inadvertently expose dielectric layers to plasma. Under conventional conditions, such exposure typically leads to dielectric damage.

It was also recognized that resputtering often occurs at a higher rate in the center of the wafer compared to the wafer edges, leading to a non-uniform etch profile. Such etch-back non-uniformity (EBNU) results from a non-uniformity in an ion flux experienced by the wafer, which is typically higher at the wafer center and is lower at the wafer edges.

It was also recognized that deposition of materials under conventional conditions results in incorporation of inert gas ions into deposited films, thereby decreasing the density of the film and degrading film quality.

Embodiments described herein address these problems by providing a higher plasma density in the proximity of the wafer substrate.

It was unexpectedly discovered that local plasma density in the proximity of the wafer substrate could be increased by the use of a positively biased "ion extractor" configured to transfer electrons from a region of a first plasma density ("donor region") to a region of a second plasma density ("acceptor region"). Such finding was unexpected, since one would not expect to increase the density of a positive ion flux with the use of a positively biased member. Further, one might expect to quench the plasma by positioning a positively biased member inside the process chamber having free electrons. Surprisingly, transfer of electrons from a first region of plasma (preferably magnetically shaped or confined plasma) to a second region of plasma led to an increase in density of positively charged ions in the second region of plasma. Magnetic confinement of plasma at the first region of plasma density ("donor plasma") is preferred, since it prevents immediate quenching of plasma with a positively biased ion extractor. In one embodiment, magnetic confinement of donor plasma is achieved with the use of looping magnetic fields generated by a first magnetic source. A variety of magnetic sources can be used, including stationary and rotating magnets, permanent magnets, electromagnets, and coils configured to ICP generation. In some embodiments, it is preferred to use capacitively-coupled plasma generation. In other embodiments, inductively coupled plasma can be used.

It is preferred in some embodiments to separate the region of donor plasma and the region of acceptor plasma by a region of lower magnetic field, e.g., by a null magnetic field. This results in increased confinement within the donor region of plasma. In one embodiment, a first magnetic field source (which may include one or several permanent magnets or electromagnets) generates a magnetic field having a first polarity in the region of the donor plasma, while a second magnetic field source generates a magnetic field having an opposite polarity in the region of the acceptor plasma.

In some embodiments, the acceptor region of plasma is also magnetically shaped or confined. In one embodiment, magnetic confinement in conjunction with electrical field of ion extractor increases the energy of the cold secondary electrons created in the donor plasma and transferred to the acceptor region of plasma, such that they become capable of further ionizing neutral atoms, thereby generating a plasma and increasing the plasma density of the acceptor plasma. In this case a magnetron effect, which traps electrons in the crossing of electric and magnetic fields is advantageously present. The ion extractor is typically a positively biased conductive member (e.g., an aluminum shield) circumferentially positioned proximate the acceptor region of plasma. The ion extractor is electrically isolated from other components of the process chamber and is electrically connected to its power supply.

While the positive bias applied to the ion extractor may differ depending on many parameters of the process, a bias of at least 30 V, preferably between about 50 and about 300 V, and even more preferably between about 100V and about 125 V can be applied. In one embodiment, a DC bias is applied to the ion extractor. In general other types of bias, such as an RF bias, a pulsed DC bias and an AC bias may also be applied.

The ion extractor operates by providing an electric field within the process chamber. Note, that the ion extractor itself, in many embodiments, does not generate a magnetic field and is therefore different from an inductive coil. While the ion extractor can be used in addition to ICP coils, to further increase plasma density of inductively coupled plasma, it operates by a different mechanism, does not need to have a coil geometry, and does not need to use a time-varied electric current.

The ion extractor can have a variety of shapes, e.g., it can be ring shaped or tube shaped (e.g., hollow-cylinder shaped), and can be circumferentially positioned above the wafer substrate.

While the present invention can be practiced in many different types of apparatus, two main types of plasma PVD apparatus, hollow cathode magnetron (HCM) and planar magnetron, will now be described. Plasma pre-clean chambers having at least one region of magnetically confined plasma can also be adapted to operate with an ion extractor.

Hollow cathode magnetron is an apparatus carrying a three-dimensional sputter target. The target has a cup-like like geometry, and can be described as a particle confining container having a wall disposed about a vertical axis of the target, a closed end surface and an open side.

The present invention is not limited to a specific cup-like geometry of an HCM target and can be used in conjunction with three-dimensional targets of a plurality of shapes, as well as with planar targets. Further, as mentioned, provided methods can be carried out in a plasma pre-clean chamber which typically does not include a sputter target.

Figure 2A:
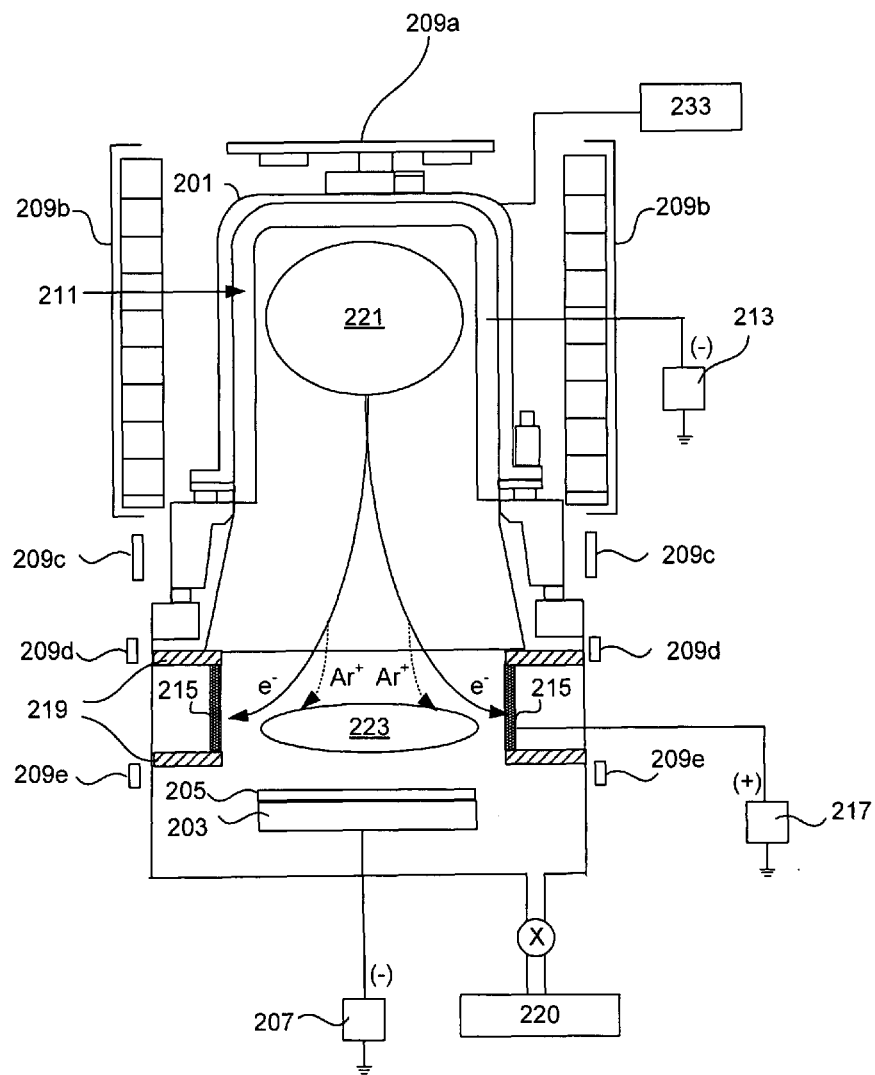
FIG. 2A is a schematic cross sectional depiction of a hollow cathode magnetron (HCM) apparatus configured to provide increased local plasma density in accordance with one embodiment described herein.

FIG. 2A presents a cross sectional view of one type of an HCM sputtering apparatus in accordance with one embodiment of the invention. The HCM apparatus has two main components, the source 201, in which a plasma is created and maintained, and the RF bias electrostatic chuck (ESC) pedestal 203, which secures the wafer 205 and applies a negative RF bias on the wafer if needed. A separate RF power supply 207 is electrically connected to the wafer pedestal and provides the negative bias to the pedestal 203 when required. An RF bias power of between about 0-3000 W can be applied. The ESC pedestal 203 also serves to provide the temperature control for the wafer 205. The temperature at the wafer pedestal can range from about −50 to 600° C., preferably between about −40 and 20° C.

In this example, the HCM contains a top rotating magnet 209a, several annular side electromagnets 209b-209e, circumferentially positioned around the process chamber, and a sputter target 211, operated at a negative DC bias. The sputter target is electrically connected to the DC target power supply 213. A DC bias power of between about 1-100 kW is typically applied to the target.

One or several shields may be positioned within the chamber next to the chamber sidewalls, to protect the sidewalls from the sputtered material. Conventionally, a shield located in the proximity of the wafer was often referred to as an anode. However, this shield operated at a floating plasma potential and was not externally electrically biased.

In the provided configuration, the shield 215 serves as an ion extractor. The ion extractor 215 is electrically connected to a separate DC power supply 217 and is configured to accept a positive bias from the power supply 217. A positive bias of at of at least about 30 V, preferably between about 50 and about 300 V, and even more preferably between about 100V and about 125 V is applied to the ion extractor. In one implementation, a power ranging from about 10 and 600 W is applied to the ion extractor.

The ion extractor shield 215 is electrically isolated from the process chamber sidewalls with two insulating ceramic rings 219. In the provided example, the shield 215 is an aluminum member having a hollow cylindrical shape, which is located about 8 cm above the wafer pedestal 203, and about 16 cm below the target 211. Note, that since the ion extractor is positively biased during operation of an HCM, its material is not substantially sputtered onto the wafer surface. Therefore, the ion extractor can be made of a variety of conductive materials, which may be different from the material being deposited or resputtered on the wafer. For example, an aluminum ion extractor can be used during tantalum or copper resputter.

The cathode target 211 generally has a hollow cup-like shape so that plasma formed in the source can be concentrated within this hollow region. The cathode target 211 also serves as a sputter target and is, therefore, made of a metal material such as tantalum or copper, which is to be deposited onto a substrate.

An inert gas, such as argon, is introduced through a gas inlet (not shown to preserve clarity) into the hollow region of the cathode target 211 powered by a DC source to form a plasma. The pump 220 is positioned to evacuate or partially evacuate the process chamber. The control of pressure in the process chamber can be achieved by using a combination of gas flow rate adjustments and pumping speed adjustments, making use of, for example, a throttle valve or a baffle plate. Typically the pressure ranges between about 0.01 mTorr to about 100 mTorr.

An intense magnetic field is produced by electromagnets 605a-605b within the cathode target region. The electrons emitted from the cathode are confined by the crossing electrical and magnetic fields within the hollow portion of the cathode target 211 to form a region of high plasma density 221. The magnetic field generated by magnets 209a and 209b can range from about 0.1-1.5 Tesla in the proximity of the target. Further, the electrons in the source are electrostatically confined in radial direction by hollow cathode effect. Thus the ionization happens not only in the proximity of the target where magnetic confinement takes place but in all target volume. Plasma densities of at least about $10^{12}$ electrons/cm³, are achieved in the plasma region 221. In one embodiment, ultra-high magnetic fields of at least about 1 Tesla in the proximity of the target, are used to generate an ultra-high density plasma in the plasma region 221. The density of such plasma is at least about $10^{13}$ electrons/cm³. The strong magnetic fields at the source not only confine the plasma in the region 221, but also contribute to plasma generation, since a major fraction of ionic species are trapped close to the source. Further, the electrons in the source are electrostatically confined in radial direction. These electrons can set up collision cascades generating secondary electrons, which are accelerated to high energy due to the sheath drop close to the target, leading to high plasma density.

Additional electromagnets 209c-209e are arranged downstream of the cathode target and are used to shape the plasma at the elevations closer to the wafer pedestal 203. The magnetic field generated by electromagnets 209c-209e is typically less strong than the magnetic field generated by the magnets 209a-209b. Conventionally, a region of lower plasma density 223 existed in the proximity of the wafer 205. Such downstream plasma was fed with the electrons and ions which escaped from the region of high density confined plasma 221. Conventionally, the density of downstream plasma 223 was at least 5 times, often 10 times lower than the plasma density in the region 221 and was radially non-uniform with the higher density in the center. For example, a plasma density of greater than about $10^{11}$ electrons/cm³ in the region of downstream plasma 223 could not be easily achieved using conventional methods.

When a positive bias is applied to the ion extractor 215, electrons are transferred from the donor region of plasma 221 to the acceptor region of plasma 223 as shown by arrows. Positive ion density is also increased in the 223 region due to a requirement of plasma quasi-neutrality. Since the ion extractor 215 is positively biased, the ions do not reach the ion extractor and are electrostatically trapped in the proximity of the wafer. Therefore, the plasma density proximate the wafer is significantly increased. Further, the ion extractor increases ion density around the wafer edges and improves the plasma uniformity at the wafer.

Figure 2B:
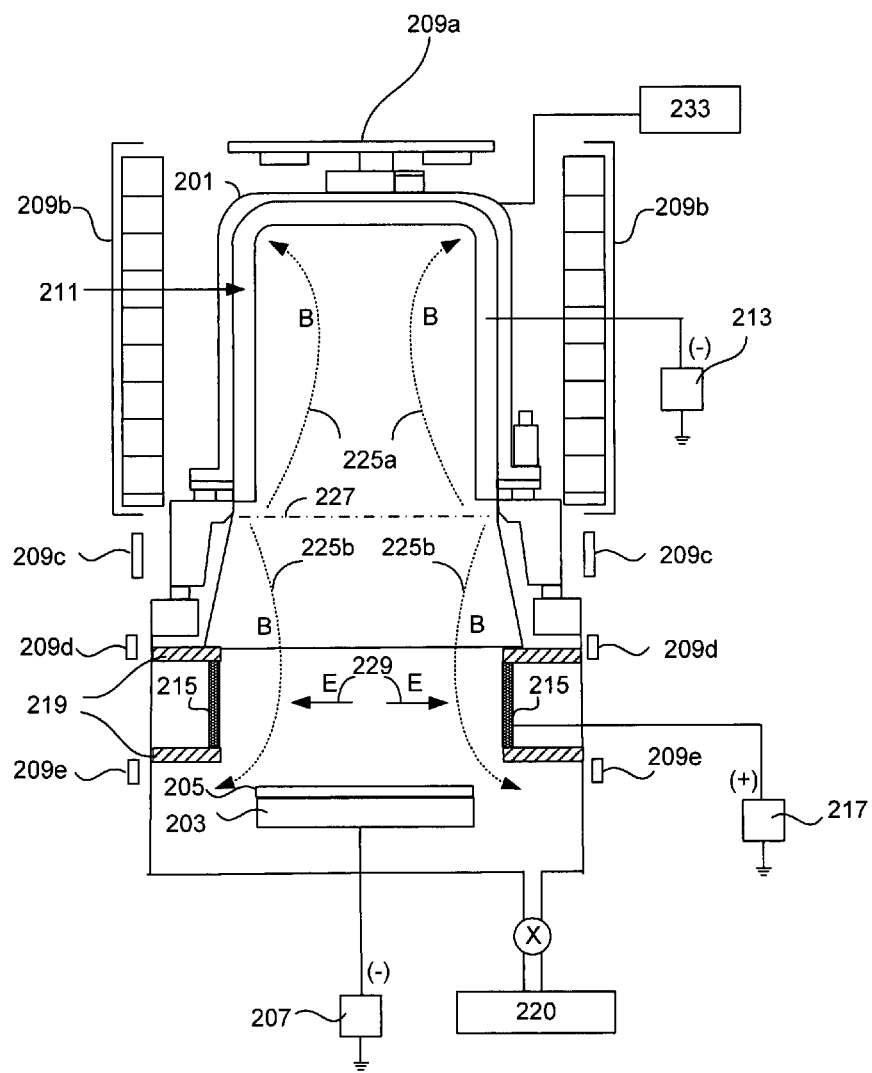
FIG. 2B is a schematic simplified depiction of electric and magnetic fields in an HCM apparatus having an ion extractor, according to one embodiment.

In the described embodiment, the confinement of plasma in the region of high plasma density 221, is further increased by the presence of a separatrix. Separatrix is the region of a null magnetic field residing between the region of donor plasma 221 and the region of acceptor plasma 223. Often, a region of lower plasma density resides between the two lobes of higher density plasma 221 and 223. Typically, in an HCM, the separatrix resides in the proximity of the target opening, but can be moved upward or downward in the chamber by the modulation of magnetic field polarity of individual magnets. The separatrix can be formed by using magnetic fields of opposite polarities to confine the upper and lower regions of plasma. This is illustrated in FIG. 2B, showing a cross-sectional depiction of an HCM with a schematic simplified depiction of magnetic field lines within the process chamber. Magnetic field of a first polarity presented by B-field lines 225a is generated by magnets 209a-b, while a magnetic field of an opposite polarity presented by B-field lines 225b is generated by magnets 209c-e. The separatrix is desired for maintaining a high plasma density in the donor plasma region 221 adjacent to the target, since it confines electrons and positively charged ions within this region.

The ion extractor can transfer both electrons and positively charged ions through the region of null magnetic field 227 and can generate high density plasma below the separatrix.

While magnetic shaping or confinement in the region of acceptor plasma 223 is not necessary in all of the embodiments, it provides several distinct benefits that will be now discussed with the reference to FIG. 2B. Magnetic shaping or confinement in this region, e.g., shaping with a magnetic field generated by downstream electromagnets 209d and 209e, further increases the density of plasma obtained with the use of an ion extractor. First, low-energy electrons extracted from the region of donor plasma can acquire sufficient energy in the electrical field of the ion extractor to cause further ionization of neutral atoms in this region, thereby increasing plasma density. Further, when an electric field generated by the ion extractor has an E-vector orthogonal to the B-vector of a magnetic field, the magnetron effect is created, which increases the electron residence time and subsequently the ionization probability for electrons before they reach an ion extractor. Thus, low-energy electrons, which would not have been further accelerated in a conventional configuration, acquire sufficient energy from the electric field while confined by the magnetron effect so that they can ionize neutral gas atoms and further increasing the plasma density. The electric field line 229 and the magnetic field line 225b are schematically illustrated in FIG. 2B. Such configuration generates a toroidally shaped plasma, which has high density at the wafer edges, which translates to an increased ion flux at the wafer edges and, eventually to reduced non-uniformity during resputter and deposition.

In certain embodiments, a system controller 233 is employed to control process conditions during deposition and resputter, insert and remove wafers, etc. The controller will typically include one or more memory devices and one or more processors. The processor may include a CPU or computer, analog and/or digital input/output connections, stepper motor controller boards, etc.

In certain embodiments, the controller controls all of the activities of the apparatus. The system controller executes system control software including sets of instructions for controlling the timing, mixture of gases, chamber pressure, chamber temperature, wafer temperature, RF power levels at the wafer, DC power levels at the target, polarity of electromagnetic coils 209a-e, power levels and current levels applied to the coils, power levels and a bias, applied to the ion extractor 215, wafer chuck or susceptor position, and other parameters of a particular process. Other computer programs stored on memory devices associated with the controller may be employed in some embodiments.

Typically there will be a user interface associated with controller 233. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, magnetic field within the chamber, electric field proximate the ion extractor, plasma density within the chamber, process gas composition and flow rates, temperature, pressure, plasma conditions such as RF and DC power levels, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A plasma control program may include code for setting RF power levels applied to the wafer chuck, DC power levels applied to the target, DC or RF power levels applied to the ion extractor, as well as polarity parameters and current levels applied to different electromagnetic coils in an apparatus. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

In one embodiment, the controller includes instructions for performing deposition or resputtering with the use of an ion extractor. For example, the instructions can specify the parameters needed to generate a high density plasma (e.g., a plasma having a plasma density of at least about $10^{12}$ ions/$cm^3$) proximate the wafer substrate and to perform resputtering or deposition using such plasma. In one embodiment, the controller includes instructions for positioning the wafer substrate on the wafer support within the process chamber; generating a plasma comprising electrons and positively charged ions having a first plasma density at a first elevation above the wafer and a second plasma density at the second elevation above the wafer, wherein the second elevation is closer to the wafer substrate than the first elevation, and applying a positive bias to the ion extractor to increase the plasma density at the second elevation above the wafer. The controller can further comprise instructions for depositing and resputtering methods that will be described in further detail below.

Figure 2C:
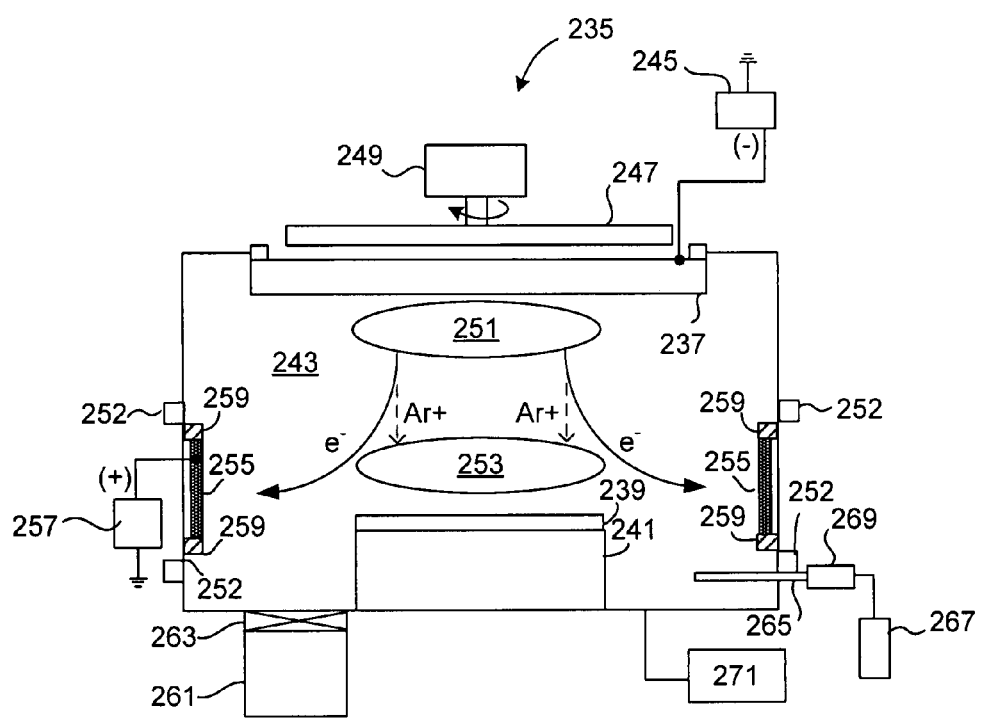
FIG. 2C is a schematic cross sectional depiction of a planar magnetron having an ion extractor in accordance with one embodiment presented herein.

As mentioned, provided methods are not limited to an HCM source, and can be practiced in a variety of process chambers, including planar magnetrons. FIG. 2C shows a schematic representation of a planar magnetron 235 according to one embodiment of the present invention. Target 237, a circular, planar block of material, is spaced from the wafer 239, which is mounted on a heating stage 241 in chamber 243. A negative bias can be optionally applied to the wafer pedestal 241 (not shown). A DC power supply 245 is used to apply a DC field to target 237, establishing plasma in the chamber below target 237. A circular magnet 247 mounted above the target is rotated by motor 249 setting up a magnetic field which is used for increasing plasma density within the chamber, and, particularly in the region adjacent to the target 237.

A region of higher density plasma 251 is thus formed at a first elevation above the wafer. Preferably, there is a significant magnetic confinement within this region of plasma. Several magnets 252 are positioned outside the process chamber 243 and are configured to shape the region of plasma 253 located proximate the wafer 239. An ion extractor 255 is positioned within the process chamber 243 and is configured to transfer electrons and ions from the region of donor plasma 251 to the region of acceptor plasma 253. The ion extractor 255 is a conductive shield circumferentially positioned proximate the wafer 239 and configured to accept a positive bias from a separate ion extractor power supply 257. The ion extractor 255 is electrically isolated from the chamber sidewalls with two insulating rings 259. The plasma density within the plasma region 253 located at a second elevation above the wafer, is increased when a positive bias is applied to the ion extractor 255 due to transfer of electrons and positively charged ions from the region of donor plasma 251. The presence of magnetic shaping in the region of acceptor plasma 253 further increases the plasma density in this region, as previously described.

Cryopump 261 connected to chamber 243 via valve 263 is used to evacuate the chamber. Process gas injector 265 is connected to process gas supply 267 via mass flow controller 269. A sputtering gas is introduced into chamber 243 via an injector 265. A process controller 271 comprises program instructions for performing resputtering and depositing methods, as described herein.

It is understood that the structure of module 235 is exemplary only. The methods of present invention may be practiced in other types of planar magnetrons, such as ones having ICP sources. In other embodiments, magnetrons without ICP sources are preferred.

Methods

Figure 3A:
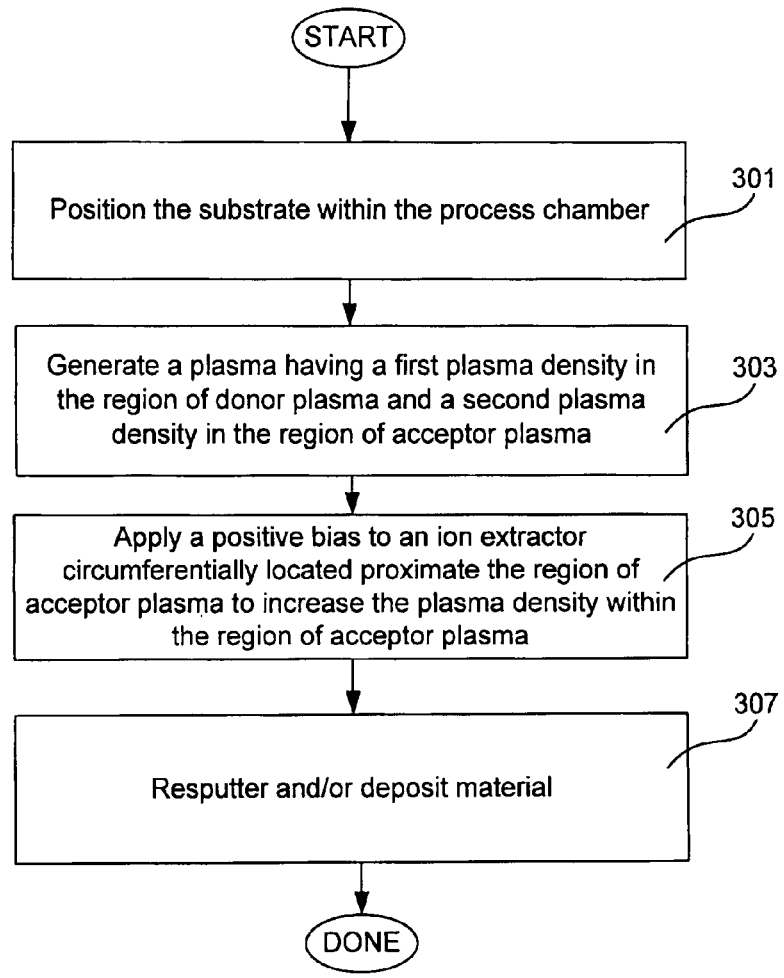
FIG. 3A presents a process flow diagram for a method of increasing local plasma density in accordance with an embodiment presented herein.
Figure 3B:
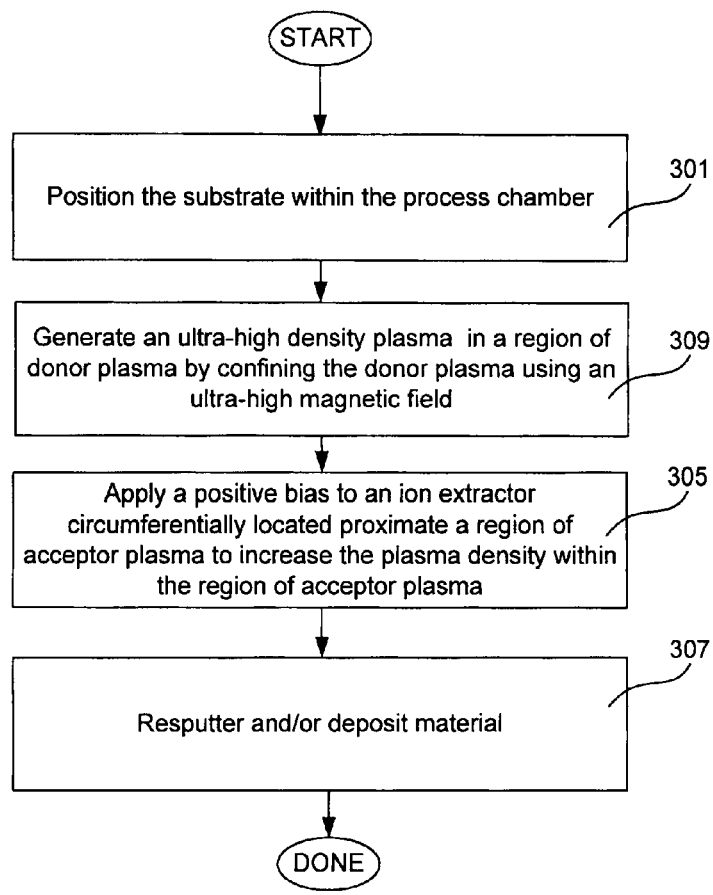
FIG. 3B presents a process flow diagram for a method of increasing local plasma density with the use of an ultra-high magnetic field in accordance with an embodiment presented herein.

Methods for increasing local plasma density will be illustrated by example process flow diagrams presented in FIGS. 3A-3B.

Referring to FIG. 3A, the process starts by positioning the substrate within the process chamber in an operation 301. Typically a semiconductor substrate having a plurality of recessed features is positioned within the process chamber configured for plasma generation, which has at least one magnetic source for plasma shaping or confinement. In some embodiments, one magnetic source shapes or confines the plasma in the donor plasma region, while a second magnetic source shapes or confines plasma in the acceptor plasma region. In some embodiments a null magnetic field separates the regions of donor and acceptor plasma. As shown, in operation 303, plasma having a first plasma density is generated in the region of donor plasma and a plasma having a second plasma density resides in the region of an acceptor plasma. The region, of donor plasma, according to one example, resides at a first elevation above the wafer substrate, e.g., at least 15 cm above the wafer, while the region of acceptor plasma resides at a lower elevation, typically within about 5 cm from the wafer. The plasma density in the donor region is typically at least about $10^{10}$ electrons/cm$^3$, preferably at least about $10^{12}$ electrons/cm$^3$, and in some cases as high as at least about $10^{13}$ electrons/cm$^3$. The plasma is generated, in one embodiment, by introducing an inert gas, such as argon, into the process chamber, maintaining the chamber pressure of between about 0.01 mTorr-100 mTorr, and supplying a negative DC bias to the cathode target having a power level of between about 1 kW and 100 kW. In one embodiment, the donor plasma is magnetically confined with a looping magnetic field in the proximity of the target. Magnetic field strength can range from about 0.1-1.5 Tesla in the proximity of the target according to one example. As shown in an operation 305, a positive bias is applied to an ion extractor circumferentially positioned proximate the region of acceptor plasma. The ion extractor resides, in one example, at an elevation between the wafer and the region of donor plasma. Preferably, the ion extractor does not extend into the region of donor plasma. While the bias applied to the ion extractor may depend on a particular process, a bias of at least about 30 V, preferably between about 50-300 V, more preferably between about 100-125 V is applied. In one implementation a DC bias at a power level of between about 10 and 600 W is applied. The electrons and positively charged ions are transferred from the region of the donor plasma to the region of acceptor plasma, thereby increasing plasma density in the region of acceptor plasma. Thus high density plasma having plasma density of at least about $10^{12}$ electrons/cm$^3$ can be generated in the region of acceptor plasma, e.g. proximate the wafer. It is understood that provided methods are not limited to generation of high-density plasmas, and can also be applied for increasing plasma density of low and medium-density plasmas to obtain plasmas having a variety of densities, e.g., on the order of about $10^{10}$-$10^{11}$ electrons/cm$^3$. The formed plasma in the acceptor region can be used to deposit and/or resputter material on the wafer surface.

There are distinct advantages of using higher density plasma in the proximity of the wafer for both deposition and resputter.

For example, according to one embodiment deposition of diffusion barrier or seed layer is performed using plasma having a density of at least about $10^{12}$ electrons/cm$^3$ proximate the wafer. The positive DC bias power level applied to the ion extractor ranges from about 50 to 250 W in this embodiment. The negative DC target power ranges between about 10-30 kW. A negative RF bias at a power level of between about 300-1500 W can also be optionally applied to the wafer. Deposition is performed using argon as a process gas at a pressure of between about 0.5-3 mTorr. Deposition under high plasma density conditions results in improved quality of deposited films, which manifests itself in reduced contamination of the film with argon ions, as well as in increased density of deposited films.

In another embodiment, provided plasmas can be used for resputtering. When plasma having a density of at least about $10^{12}$ electrons/cm$^3$ is generated in the proximity of the wafer, resputtering with high E/D ratios can be performed. For example, E/D ratios of greater than about 4, e.g., greater than about 6 can be achieved using the following conditions. The positive DC bias power level applied to the ion extractor ranges from about 50 to 250 W in this embodiment. The negative DC target power ranges between about 1-10 kW. A negative RF bias at a power level of between about 300-1500 W is applied. Resputtering is performed using argon as a process gas at a pressure of between about 0.5-30 mTorr.

In another embodiment, resputtering is performed using high-density low ion energy plasma. In this embodiment, plasma having a density of at least about $10^{12}$ electrons/cm$^3$ is generated in the proximity of the wafer, but its energy is kept low by applying a relatively small negative RF bias to the wafer. In one such embodiment, an ion flux of at least about $10^{15}$ ions/cm$^2$s having a mean energy of less than about 200 V is formed at the wafer surface. Such plasma can achieve efficient material removal without causing significant microtrenching in a dielectric, if dielectric layers become exposed during resputtering. For example E/D ratios of at least about 1.5, preferably at least about 2 can be achieved in the field region and E/D ratios of at least about 3 can be achieved at the recessed feature bottoms, without causing substantial microtrenching in the dielectric layer. Further, improved etch-back non-uniformity of less than about 10% and less than about 3% were achieved for E/D ratios of 2 and 1.5 respectively. The following conditions can be used for resputtering in high density low energy plasma regime. The positive DC bias power level applied to the ion extractor ranges from about 80W to 250 W in this embodiment (corresponding to 80-150 V). The negative DC target power ranges between about 4-10 kW. A negative RF bias at a power level of between about 300-1000 W is applied. Preferably, for the low ion energy regime, the RF bias power at the wafer is less than about 800 W, such as less than about 500 W. The RF bias power values described herein refer to a 300 mm wafer and one skilled in the art will understand how to scale these parameters for larger or smaller substrates. Resputtering is performed using argon as a process gas at a pressure of between about 0.5-3 mTorr.

FIG. 3B presents a process flow diagram for a particular embodiment of present invention, which makes use of ultra-high magnetic fields to achieve high plasma densities. The substrate is positioned within the process chamber in the operation 301. The ultra-high density donor plasma is generated using confinement with an ultra-high magnetic field in an operation 309. The generation of such plasmas is described in detail in the commonly assigned patent application Ser. No. 11/807,183 titled "The Use of Ultra-High Magnetic Fields In Resputter and Plasma Etching" naming Kinder et al. as inventors, filed May 24, 2007, which is herein incorporated by reference in its entirety and for all purposes. According to this method, donor plasma having a density of at least about $10^{13}$ electrons/cm$^3$ can be generated using a magnetic field having a strength of at least about 1 Tesla in the proximity of the target. In an operation 305, the positive bias is applied to the ion extractor, as previously described, and ions and electrons are transferred from the region of the ultra-high density donor plasma to the region of acceptor plasma. Extremely high plasma densities can be obtained in an acceptor region of plasma according to this embodiment, e.g., plasma densities of at least about $10^{12}$ electrons/cm$^3$, and, in some cases, at least about $10^{13}$ electrons/cm$^3$ can be obtained in the region of acceptor plasma close to the wafer. Such plasma can be used for deposition or resputtering as previously described.

Figure 4:
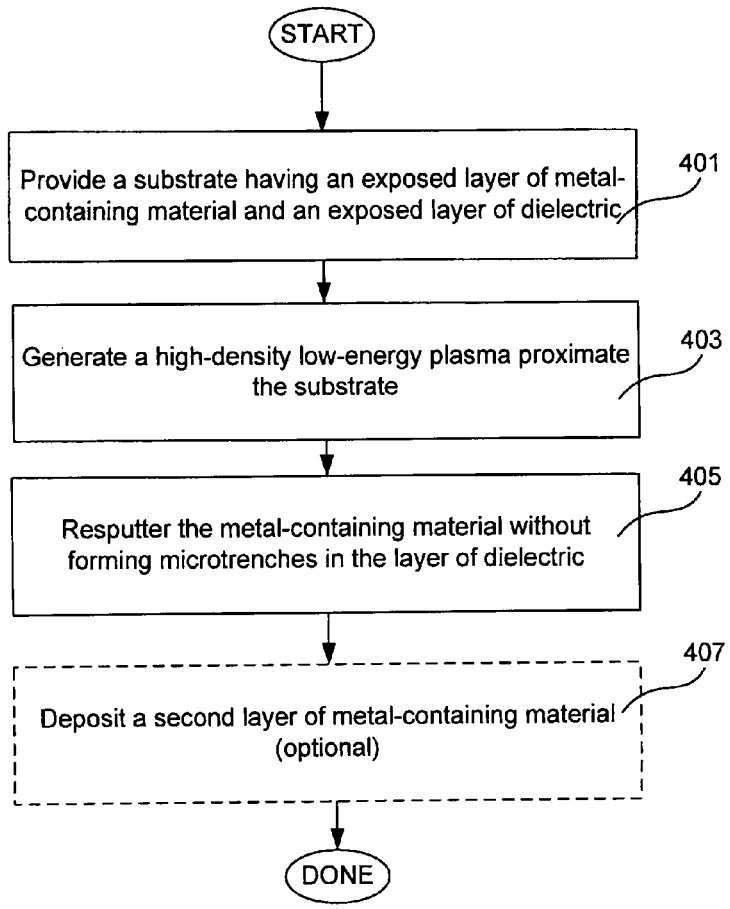
FIG. 4 presents a process flow diagram for resputtering material in the presence of an exposed dielectric in accordance with an embodiment presented herein.

FIG. 4 presents a process flow diagram for a resputtering process in the presence of an exposed dielectric, according to one embodiment presented herein. In an operation 401, a substrate having an exposed layer of metal-containing material and an exposed layer of dielectric is provided. "Provided" as used herein refers to obtaining such substrate during any stage of fabrication, e.g., before, during, or after a resputtering operation. For example, a layer of dielectric may become exposed during resputter. The metal-containing material can include a diffusion barrier material, e.g., Ta, TaN$_x$ and the like, a seed layer material, such as copper, or metal line material, such as copper. A dielectric may include a low-k dielectric, e.g., a dielectric with a k of less than about 3.5, an ultra low-k dielectric, e.g., a dielectric with a k of less than about 2.5, a porous dielectric and the like. Examples of such dielectrics include carbon-doped silicon dioxide (CDO's), hydrogenated oxycarbide, fluorine-doped silicon dioxide, e.g., fluorosilicate glass (FSG), organic containing low-k dielectrics, etc. In an operation 403, a high-density low-energy plasma is generated proximate the substrate using an apparatus configured with an ion extractor, as described above. The metal-containing material is resputtered in the presence of an exposed dielectric without forming microtrenches in the dielectric layer, in an operation 405. Resputtering may involve removing a layer of diffusion-barrier material, and forming an anchor recess in an underlying metal line. For example, between about 20-600 Å can be removed in a single resputtering operation. Alternatively, short profiling cycles of deposition and resputter may be performed, with each resputtering operation removing more material than is deposited in the deposition operation. Such technique further resists microtrenching and can be applied in conjunction with the methods described herein. It is described in detail in the commonly assigned Pat. No. 7,842,605 titled "A Method for Reducing Dielectric Damage" naming Pradhan et al. as inventors, issued Nov. 30, 2010, which is herein incorporated by reference in its entirety and for all purposes. Finally, after resputtering operation 405 is completed, a second layer of metal-containing material (e.g., a diffusion barrier material) is optionally deposited in an operation 407 to coat the exposed dielectric.

Microtrenching

Figure 5A:
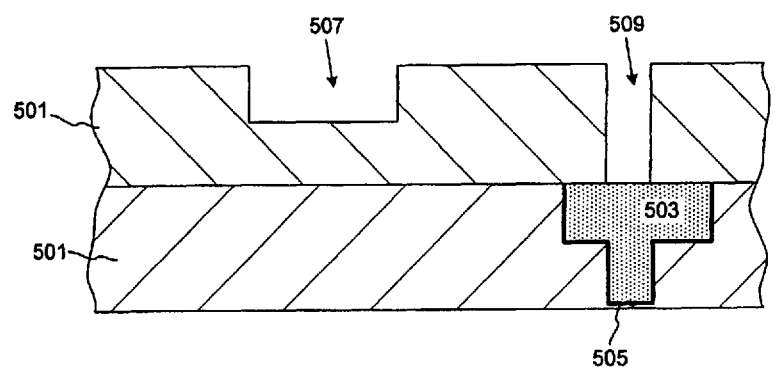
FIGS. 5A-5D show cross sectional depictions of a partially fabricated integrated circuit during barrier layer deposition and during resputtering with low density plasma. Microtrenching phenomenon is illustrated.

Microtrenching will now be illustrated in the context of formation of anchor recesses. It is often desirable to use resputter for etching through the via into the underlying copper line. The sequence of wafer processing steps resulting in such punch-through etching is depicted in FIGS. 5A-5D. Referring to FIG. 5A, a cross-sectional depiction of a wafer substrate is shown. The substrate comprises two layers of dielectric 501, where the top layer is patterned with two recesses, a trench 507, and a via 509. For clarity reasons, an isolated trench and a via are illustrated, while in practice the trench often resides over the via as shown in FIGS. 1A-1H. The dielectric 501 may be a low-k dielectric such as carbon doped silicon dioxide, hydrogenated silicon oxycarbide (Si-COH), fluorine doped silicon dioxide, or organic-containing low-k dielectric. A conductive line 503 resides in the underlying dielectric layer directly below the via 509. Conductive lines are most commonly copper lines. The sides and the bottom of the copper line are coated with a diffusion barrier layer 505, which prevents the diffusion of copper into the dielectric layer 501. Etch-stop and antireflective layers, such as 113 and 117 of FIG. 1C, are not shown for clarity reasons.

Figure 5B:
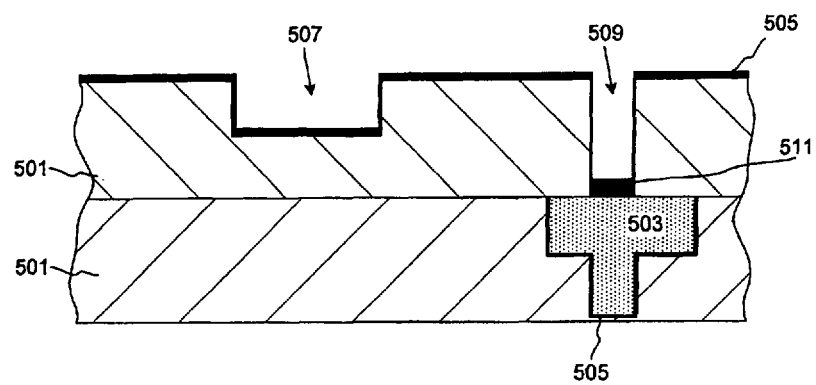
Figure 5C:
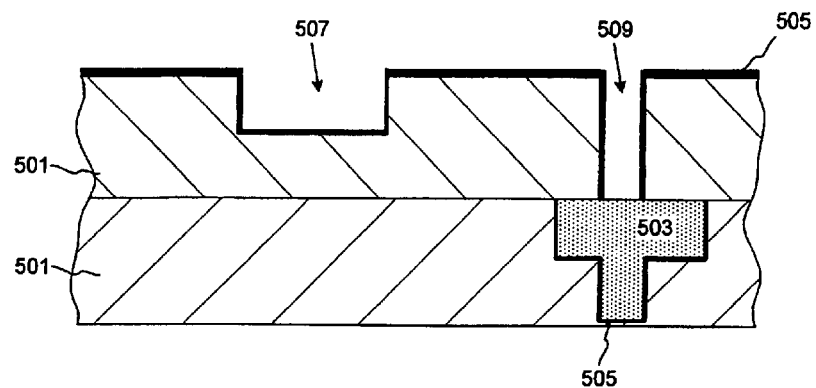

The exposed top dielectric layer is then subjected to a diffusion barrier deposition step resulting in the structure shown in FIG. 5B. It can be seen that after the deposition step, diffusion barrier layer 505 covers the surface of top dielectric layer both in the field and in the recesses. The uniformity of such coverage, however, is low, particularly in the via region. There is significant accumulation of the barrier material in the via bottom 511, and a very thin coverage of the via sidewalls. Uniformity of the via coverage is improved through the resputter step, which leads to the structure shown in FIG. 5C. In this structure all of the barrier material is resputtered from the via bottom onto the sidewalls exposing the underlying copper line. The desired result of this operation is a better, more uniform coverage of the sidewalls in the via.

Figure 5D:
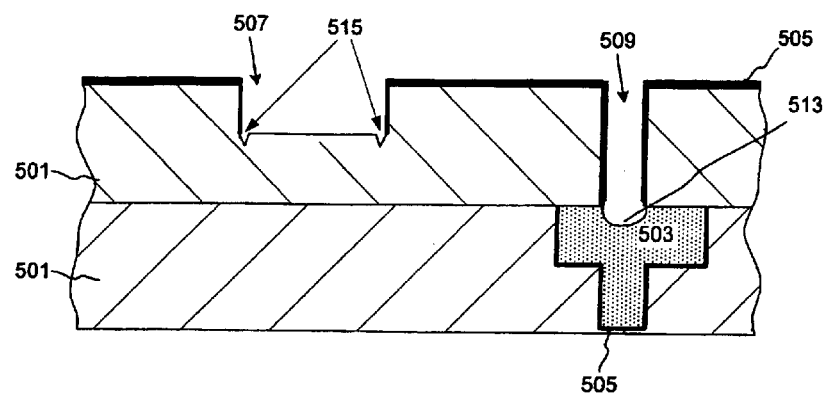

When resputtering is performed further, it etches material of the copper line residing below the via leading to formation of a cavity in the conductive line, known as an anchor recess. The structure with an anchor 513 is shown in FIG. 5D. The anchor is a desired feature in the fabrication of an IC device since it would result in a mechanically strong interconnect when the via is filled with metal. At the same time, resputtering leads to undesired and unintentional changes in the trench region. The bottom of the trench is stripped of the barrier layer, and the dielectric becomes exposed to the impact of high-energy ions. Further resputtering of an exposed dielectric in the trench, especially in a high E/D mode leads to a microtrenching problem. Microtrenches 515 are formed at particular spots in the dielectric layer of the trench bottom, usually in the proximity of the sidewalls. It is believed that reflection of high-energy ions from the trench sidewalls onto particular locations of dielectric in the trench bottom causes increased bombardment of dielectric in these particular sites. The impact of resputtering is, therefore, increased in these spots leading to higher localized etching and formation of microtrenches. This effect is especially pronounced for low-k dielectric, since they are often brittle and easily damaged materials. Microtrenching in silicon dioxide dielectric usually does not occur as readily. Microtrenches can form at any point during the resputtering process when dielectric becomes exposed to argon and/or metal ions. Depending on the relative thickness of the barrier layer in the trench and in the via bottom, the trench bottom dielectric can become exposed in the beginning or at the end of barrier layer resputtering in the via or during the etch-back of copper line during anchor formation.

Microtrenches are viewed as undesired features in IC devices since they contribute to level-to-level current leakage, result in poor adhesion of subsequently deposited layers leading to decreased reliability of the integrated circuit. Referring to FIG. 5D, the microtrenching phenomenon is illustrated for a resputter process carried out in a conventional regime characterized by the highest density of plasma proximate the substrate of less than about $10^{11}$ electrons/cm$^3$ and using a wafer RF bias of at least about 1200 W.

In an embodiment presented herein, the resputter step is performed using a low-energy high-density plasma obtained with the use of an apparatus equipped with an ion extractor. In this regime, a plasma having a plasma density of at least about $5 \cdot 10^{11}$ electrons/cm$^3$, preferably at least about $10^{12}$ electrons/cm$^3$ is present within about 2 cm of the wafer. Such plasma allows efficient resputtering with a relatively low RF bias of less than about 600 W applied to the wafer.

Figure 5E:
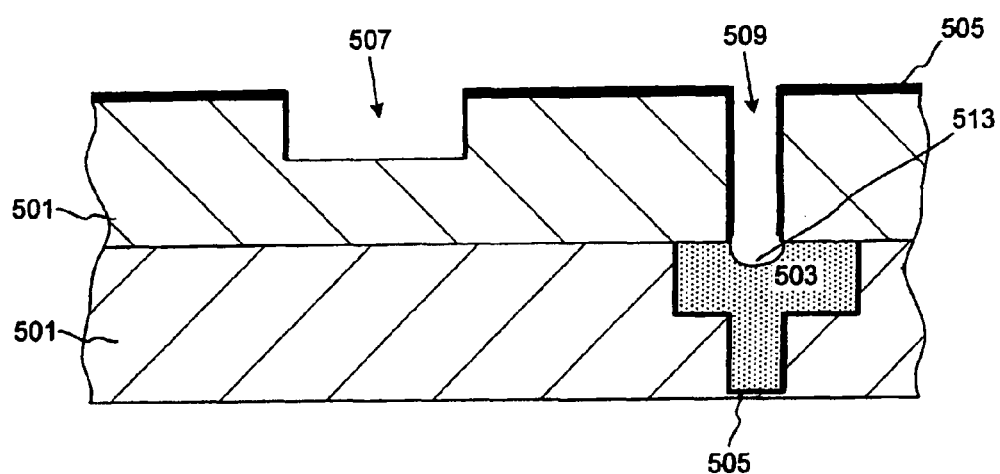
FIG. 5E presents a cross sectional depiction of a partially fabricated integrated circuit obtained by a high plasma density resputter process and illustrates the absence of microtrenches.

When wafer layers undergo resputtering using a low ion energy high-density plasma, the damage to dielectric layer is minimal and microtrenching is reduced or eliminated. This is illustrated in FIG. 5E which presents the cross-sectional depiction of a wafer portion, subjected to the same processing steps as structure shown in FIG. 5D, except that resputtering is performed in a low ion energy high-density regime. It can be seen that microtrenches did not form in the trench region 507. It is understood, however, that certain amount of dielectric etching is permissible and does not constitute dielectric damage. Damage refers to increased local rates of etching, e.g., resulting in microtrenching and surface roughness.

Experimental

Figure 6A:
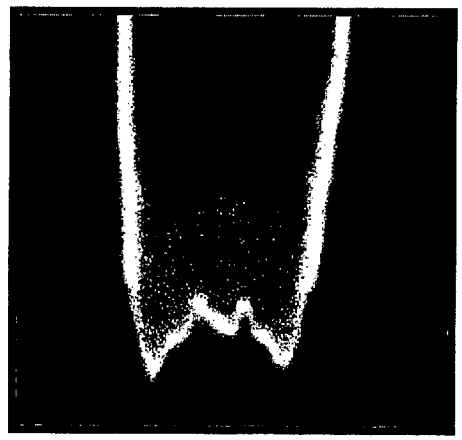
FIGS. 6A-6B present experimental data showing scanning electron micrograph (SEM) images of device cross-sections illustrating a trench array fabricated using low local plasma density (6A), and high local plasma density (6B) resputtering. Elimination of microtrenching in a high plasma density process is illustrated.

FIG. 6A presents a scanning electron micrograph (SEM) image of a trench obtained after conventional resputtering was performed. Microtrenches formed next to the sidewalls at the trench bottom are clearly seen. The following conditions were used. The resputtering operation removed 500 Å of copper from the bottom of the via, while exposing an ultra low k (k<2.5) dielectric at the bottom of the trench to plasma. An E/D ratio of about 6 in the bottom of the via was achieved. EBNU of about 10% was observed.

The plasma density within 2 cm from the wafer was estimated to be about $5 \cdot 10^{10}$ ions/cm$^3$. Resputtering was performed in an HCM without an ion extractor, using argon as a process gas. Resputtering was performed at a pressure of 2.5 mTorr. A negative DC bias was applied to the target at a power level of 1.5 kW. A negative RF bias was applied to the wafer at a power level of 1200 W.

Figure 6B:
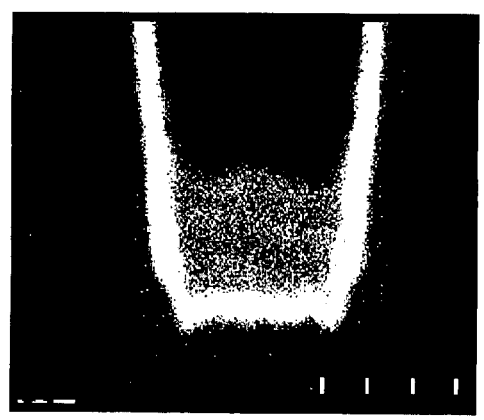

FIG. 6B presents a scanning electron micrograph (SEM) image of a trench obtained after resputtering using high-density low-energy plasma generated in an apparatus equipped with an ion extractor. It can be seen that microtrenching was eliminated.

The following conditions were used. The resputtering operation removed 500 Å of copper from the bottom of the via, while exposing an ultra low k (k<2.5) dielectric at the bottom of the trench to plasma. An E/D ratio of about 6 in the bottom of the via was achieved. EBNU of about 8% was observed.

The plasma density within 2 cm from the wafer was estimated to be about $5 \cdot 10^{11}$ ions/cm$^3$. Resputtering was performed in an HCM with an ion extractor, using argon as a process gas. Resputtering was performed at a pressure of 2.5 mTorr. A positive DC bias of 100V at a power level of 100 W was applied to the ion extractor. A negative DC bias was applied to the target at a power level of 6 kW. A negative RF bias was applied to the wafer at a power level of 400 W. Note that good E/D ratio and good non-uniformity were achieved in this case without damaging the low-k dielectric.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. An apparatus for processing material on a semiconductor wafer, comprising:
    (a) a process chamber having an inlet for introduction of an inert gas;
    (b) a wafer support for holding the wafer in position during processing of the material;
    (c) a first magnetic field source configured to generate a first magnetic field capable of shaping plasma in a first plasma region at a first elevation above the wafer support;
    (d) a second magnetic field source configured to generate a second magnetic field capable of shaping plasma in a second plasma region at a second elevation above the wafer support, wherein the second elevation is closer to the wafer support than the first elevation; and
    (f) an ion extractor positioned within the process chamber and configured to accept a positive DC bias, wherein the ion extractor is configured to increase plasma density and maintain the increased plasma density at the second elevation above the wafer support by transferring electrons generated in the first plasma region to the second plasma region, and wherein the ion extractor is configured to generate an electric field, wherein E vector, characterizing the electric field generated by the positively biased ion extractor crosses with the B vector generated by the second magnetic field source.

2. The apparatus of claim 1, wherein the second elevation is proximate the wafer support.

3. The apparatus of claim 1, wherein the second elevation is within about 3 cm from the wafer support.

4. The apparatus of claim 1, wherein the first elevation is at least about 15 cm from the wafer support.

5. The apparatus of claim 1, wherein the ion extractor is circumferentially positioned proximate the second elevation.

6. The apparatus of claim 1, wherein the ion extractor comprises a conductive member electrically isolated from other members of the process chamber.

7. The apparatus of claim 1, wherein the ion extractor is electrically connected to an ion extractor power supply.

8. The apparatus of claim 1, wherein the ion extractor power supply is a DC power supply.

9. The apparatus of claim 1, wherein the first magnetic field is stronger than the second magnetic field.

10. The apparatus of claim 1, further comprising a target.

11. The apparatus of claim 10, wherein the target is planar.

12. The apparatus of claim 10, wherein the target comprises a particle container, configured for plasma confinement within the target.

13. The apparatus of claim 1, wherein the first magnetic field source and the second magnetic field source comprise electromagnets.

14. The apparatus of claim 1, wherein the first magnetic field source is configured to generate the magnetic field having a strength between about 0.1-1.5 Tesla proximate a target.

15. The apparatus of claim 1, wherein the first magnetic field source is configured to generate an ultra-high magnetic field having a strength of at least about 1 Tesla proximate a target.

16. The apparatus of claim 1, wherein the ion extractor is configured to maintain a plasma density of at least about $10^{11}$ electrons/cm$^3$ at the second elevation above the wafer support.

17. The apparatus of claim 1, wherein the ion extractor is configured to maintain a plasma density of at least about $10^{12}$ electrons/cm$^3$ at the second elevation above the wafer support.

18. An apparatus of claim 1 further comprising a controller comprising program instructions for:
  (i) positioning the wafer substrate on the wafer support within the process chamber;
  (ii) generating a plasma comprising electrons and positively charged ions, said plasma having a first plasma density at the first elevation above the substrate and a second plasma density at the second elevation above the substrate; and
  (iii) applying a positive DC bias to the ion extractor circumferentially located proximate the second elevation to thereby extract electrons from the region of the first plasma density to the region of the second plasma density and maintain a high plasma density in the region of the second plasma density.

19. The apparatus of claim 18, further comprising instructions for resputtering a material on the wafer surface.

20. The apparatus of claim 18, further comprising instructions for depositing a material on the wafer surface.

21. The apparatus of claim 18, wherein (iii) comprises applying a bias of between about 50-300V to the ion extractor.

22. The apparatus of claim 18, further comprising instructions for generating an ultra-high magnetic field having a strength of at least about 1 Tesla.

23. The apparatus of claim 18, wherein the program instructions for generating the plasma comprise instructions for producing a chamber pressure of between about 0.5-3 mTorr.

24. The apparatus of claim 1, wherein the E vector and the B vector are substantially orthogonal.

25. The apparatus of claim 1, wherein crossing of electric and magnetic fields in the second plasma region is configured to accelerate trapped electrons.

26. The apparatus of claim 1, wherein the ion extractor and the second magnetic field source are configured to generate a toroidal plasma region above the wafer.

27. The apparatus of claim 1, wherein the ion extractor is configured to accept positive DC bias of at least about 100 V.

28. The apparatus of claim 1, wherein the ion extractor is configured to accept positive DC bias of between about 100-125 V.

29. The apparatus of claim 1, wherein the ion extractor and the second source of magnetic field are disposed at substantially the same elevation above the wafer.

30. The apparatus of claim 29, wherein the second source of magnetic field comprises an electromagnet.

* * * * *